United States Patent
Kawasaki

(10) Patent No.: US 7,640,473 B2
(45) Date of Patent: Dec. 29, 2009

(54) SEMICONDUCTOR INTEGRATED CIRCUIT APPARATUS AND CONTROL METHOD THEREOF

(75) Inventor: Tatsuya Kawasaki, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 309 days.

(21) Appl. No.: 11/711,868

(22) Filed: Feb. 28, 2007

(65) Prior Publication Data

US 2007/0234153 A1 Oct. 4, 2007

(30) Foreign Application Priority Data

Mar. 1, 2006 (JP) ............................. 2006-055192

(51) Int. Cl.
*G01R 31/28* (2006.01)
(52) U.S. Cl. .................................................. 714/726
(58) Field of Classification Search ................. 714/724, 714/726, 733, 734, 30, 718, 763, 14, 3; 365/200, 365/201; 711/100, 113, 18, 170, 165, 166
See application file for complete search history.

(56) References Cited

U.S. PATENT DOCUMENTS 6,370,664 B1 * 4/2002 Bhawmik ..................... 714/729
2004/0153762 A1 * 8/2004 Flynn et al. .................... 714/15

FOREIGN PATENT DOCUMENTS

JP          6-052070          2/1994

* cited by examiner

*Primary Examiner*—Phung M Chung
(74) *Attorney, Agent, or Firm*—Foley & Lardner LLP

(57) ABSTRACT

A semiconductor integrated circuit apparatus includes an internal logic circuit unit, a first memory, a second memory and a control circuit unit. The internal logic circuit unit includes scan chains which test circuit normality. The first memory is accessed by the internal logic circuit. The second memory stores valid bits associated with the first memory, wherein the valid bits indicates one of validity and invalidity of data stored in the first memory. The control circuit unit saves internal state data stored in the scan chains to the first memory, and resets the internal state data saved in the first memory to the scan chains.

18 Claims, 14 Drawing Sheets

SEMICONDUCTOR INTEGRATED CIRCUIT APPARATUS AND CONTROL METHOD THEREOF

BACKGROUND OF THE INVENTION

1. Field of the Invention

The present invention relates to a semiconductor integrated circuit apparatus and a control method thereof, in particular, a semiconductor integrated circuit apparatus having a circuit for saving and recovering data representing internal state and a control method thereof.

2. Description of the Related Art

In recent years, attention is being given to a semiconductor integrated circuit having a low power consumption mode such as a standby-function and a resume function. Generally, in the semiconductor integrated circuit, except for a nonvolatile memory, an internal state is erased when a power supply is stopped. Thus, when the power supply is restarted, to restart the circuit operation from the state immediately before the power supply to the circuit was stopped, the internal state needs to be stored.

For example, Japanese Laid-Open Patent Application JP-A-Heisei 06-52070 discloses an integrated circuit for saving and holding internal state data held in registers in an external memory at the time of stopping of the power supply. This integrated circuit has a plurality of registers, a data saving portion and a data recovery portion. The plurality of registers is connected to form scan chains. The data saving portion responds to an external signal, allows the plurality of registers to form the scan chains in a data saving mode and reads out the data held in each register through the formed scan chains. At this time, the data saving portion serially/parallelly converts the internal state data into data with a predetermined bit width and stores the converted data in a data protection memory through a data input/output portion. In response to the external signal, the data saving portion allows the plurality of registers to form the scan chains and recovers the saved data to the original register through the formed scan chains in a data recovery mode. At this time, the data saving portion reads out the internal state data from the data protection memory, receives it from the data input/output means and converts the data with the predetermined bit width into serial internal state data to be recovered through the scan chains.

As described above, to store the internal state of the semiconductor integrated circuit apparatus, a battery backed-up memory is required.

SUMMARY OF THE INVENTION

In order to achieve an aspect of the present invention, the present invention provides a semiconductor integrated circuit apparatus including: an internal logic circuit unit configured to include scan chains which test circuit normality; a first memory configured to be accessed by the internal logic circuit; a second memory configured to store valid bits associated with the first memory, wherein the valid bits indicates one of validity and invalidity of data stored in the first memory; and a control circuit unit configured to save internal state data stored in the scan chains to the first memory, and reset the internal state data saved in the first memory to the scan chains.

In the present invention, the internal state data (e.g. internal state data of the CPU) in the scan chains (e.g. scan flip-flops) are saved to the first memory (e.g. cache memory), and the saved internal state data reset in the original scan chain. Accordingly, for example, even when the CPU is put into the waiting state and power supply is stopped after saving of the internal state, the operation can be restarted at high speed. Because of use of the first memory, another separate memory for holding the internal state data therein need not be provided.

According to the present invention, even when an external memory is not provided, an internal memory which stores the internal state of the semiconductor integrated circuit apparatus therein can be provided. By using the internal memory, additional circuits can be reduced. Furthermore, according to the present invention, when the data stored in the internal memory can be reset in flip-flops when returning from interruption of power supply, thereby making the speed of returning from interruption of power supply higher.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

Figure 1:
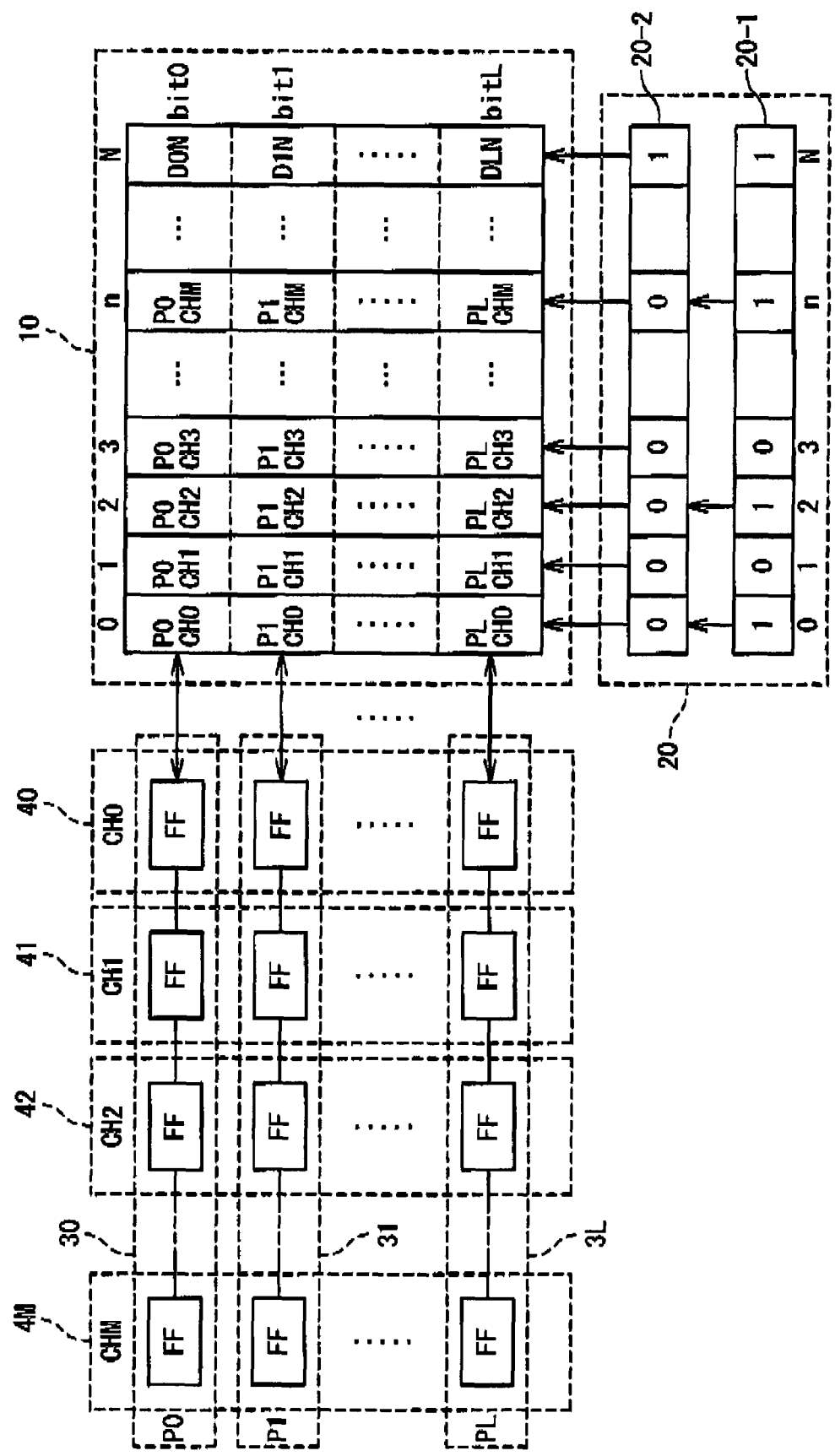
FIG. 1 is a schematic view for describing a first embodiment of the present invention.

A first embodiment of the present invention will be described referring to drawings. FIG. 1 is a schematic view showing scan chains, a cache memory and a valid bit memory which are built in a semiconductor integrated circuit apparatus according to the first embodiment. The semiconductor integrated circuit apparatus has a cache memory 10, a valid bit memory 20 which stores valid bits representing validity of data stored in the cache memory 10 therein and scan flip-flop groups which hold internal state data of the semiconductor integrated circuit apparatus therein. The cache memory 10 is a memory of (N+1) words×(L+1) bits/word. The valid bits representing validity of the data stored in respective words of the cache memory 10 are stored in the valid bit memory 20. Here, 1 bit is assigned to 1 word of the cache memory 10. Thus, the valid bit memory 20 stores information of (N+1) bits therein.

Data representing the internal state of the semiconductor integrated circuit are held in scan flip-flops. At the time of saving of the internal state data, the scan flip-flops form the scan chains 30, 31, ..., 3L and serially output the held internal state data through the scan chains 30, 31, ..., 3L. At the time of recovery, the scan flip-flops reset the saved internal state data through the scan chains 30, 31, ..., 3L. The scan chains 30, 31, ..., and 3L as serial I/O input or output the internal state data in sequence according to a synchronous clock. At the time of output, data of (L+1) bits are output in parallel in the order of the scan flip-flop group 40 (stored data are referred to as CH0) which is connected to output nodes, a scan flip-flop group 41 (CH1), a scan flip-flop group 42 (CH2) ..., a scan flip-flop group 4M (CHM).

Initially, as shown in a content 20-1 of the valid bit memory 20, the valid bit memory 20 indicates that data at addresses 0, 2, ..., n, ..., N are "valid (=1)" and data at addresses 1, 3, ... are "invalid (=0)". Since there exists no data stored previously in the memory in which the data output from the scan chains are stored, the valid bits become "invalid (=0)". In the present embodiment, the scan data output from the output nodes of the scan chains 30, 31, ..., 3L are stored sequentially from the head of the cache memory 10. Thus, contents in the cache memory 10 for the length (M+1) of the scan chains 30, 31, ..., 3L becomes the data output from the scan chains. It is assumed that the address is n, in the corresponding content 20-2 of the valid bit memory 20, all valid bit data up to the address n become "invalid (=0)".

In other words, it is assumed that data serially output from the scan chains 30, 31, ..., 3L are P0, PI, ..., PL, respectively, as shown in FIG. 1, for example, a data P0CH0 is stored in a memory bit 0 at an address 0 of the cache memory 10 and a data P1CH3 is stored in a memory bit 1 at an address 3 of the cache memory 10. At an address n, data CHM of the scan flip-flop group 4M are stored and at addresses following an address (n+1), original data in the cache memory 1 remain as they are. For example, at an address N, data D0N, D1N, ..., DLN are stored without being changed.

At the time of recovery, the internal state data stored in the cache memory 10 are read from the head of the cache memory 10, are sequentially fed to the scan chains 30, 31, ..., 3L and shifted in the scan chains. The data at the time of recovery are fed from the scan flip-flop group 4M and when (M+1) pieces of data are fed to the scan chains 30, 31, ..., 3L, the data P0CH0 to PLCH0 initially read are reset in the scan flip-flop group 40.

Figure 2:
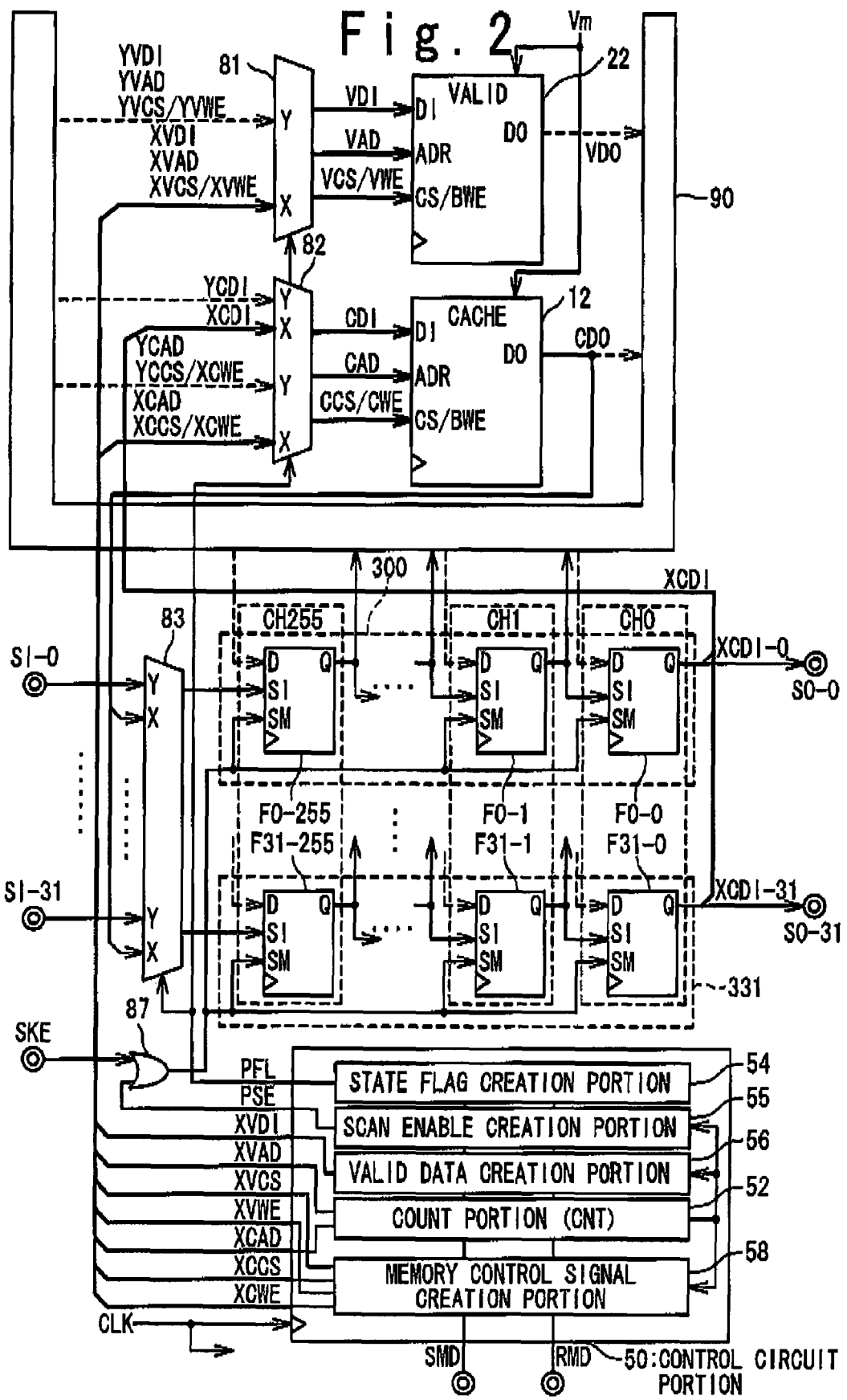
FIG. 2 is a block diagram showing configuration of a semiconductor integrated circuit in accordance with the first embodiment of the present invention.

FIG. 2 is a block diagram showing configuration of the semiconductor integrated circuit apparatus according to the first embodiment. The semiconductor integrated circuit apparatus includes an internal logic circuit portion 90, a cache memory 12, a valid bit memory 22, selection circuits 81, 82 and 83, an OR circuit 87, a control circuit portion 50 and scan flip-flops F0-0 to F0-255, ..., F31-0 to F31-255. The internal logic circuit portion 90 and the scan flip-flops F0-0 to F0-255, ..., F31-0 to F31-255 are circuits operating as, for example, a CPU (central processing unit) during normal operation. Hereinafter, the circuit formed of the internal logic circuit portion 90 and the scan flip-flops F0-0 to F0-255, ..., F31-0 to F31-255 will be described as the CPU. The internal logic circuit portion 90 is a part of the combinational circuits included in the CPU and receives signals output from the scan flip-flops F0-0 to F0-255, ..., F31-0 to F31-255 to perform a logical operation. The internal logic circuit portion 90 outputs the result of the logical operation to the scan flip-flops F0-0 to F0-255, ..., F31-0 to F31-255 and holds it as the internal state. Thus, in a normal operation, the internal logic circuit portion 90 supplies a data input signal YCDI, an address signal YCAD, a chip select signal YCCS and a write enable signal YCWE to the cache memory 12 to get access to the cache memory 12 and reads out data according to a data output signal CD0. At the same time, the internal logic circuit portion 90 supplies a data input signal YVD1, an address signal YVAD, a chip select signal YVCS and a write enable signal YVWE to the valid bit memory 22 and gets access to the valid bit memory 22 and reads out data according to a data output signal VDO.

In a scan test for testing normality of a circuit operation, the scan flip-flops F0-0 to F0-255, ..., F31-0 to F31-255 form the scan chains 300 to 331. Scan input signals SI-0 to SI-31 as serial test data are supplied from corresponding input ports. Serial scan output signals SO-0 to SO-31 as test results are output from output ports.

According to the present invention, using the scan chains, the data representing the internal state of the semiconductor integrated circuit apparatus are saved and recovered. For this reason, the selection circuits 81, 82 and 83 switch the normal data, the test data and the internal state data of the semiconductor integrated circuit. The selection circuit 81 switches an address signal VAD, an input data signal VDI and memory control signals VCS/VWE such as chip select and write enable signals, which are supplied to the valid bit memory 22. The selection circuit 82 switches an address signal CAD, an input data signal CDI and memory control signals CCS/CWE such as chip select and write enable signals, which are supplied to the cache memory 12. The selection circuit 83 switches serial signals supplied to the scan chains 300 to 331. The scan chains 300 to 331 fetch the scan test data supplied from the outside or the internal state data stored in the cache memory 12. Thus, the selection circuit 83 switches the scan input signals SI-0 to SI-31 and an output signal CDO of the cache memory 12, and feeds them as serial inputs of the scan chains 300 to 331.

The OR circuit 87 performs the logical OR operation between an external scan enable signal SKE of instructing the shift operation of the scan chain at the scan test and a protecting scan enable signal PSE generated by the control circuit portion 50, and feeds the logical OR to each scan flip-flop, thereby allowing each scan flip-flop to perform the scan chain operation (shift operation).

The cache memory 12 is accessed from the CPU formed of the internal logic circuit portion 90 and the scan flip-flops F0-0 to F0-255, ..., F31-0 to F31-255. The cache memory 12 is a high-speed memory provided for reducing access to an external main memory to speed up processing. The valid bits representing whether the contents are valid or invalid are stored in the valid bit memory 22.

Figure 3:
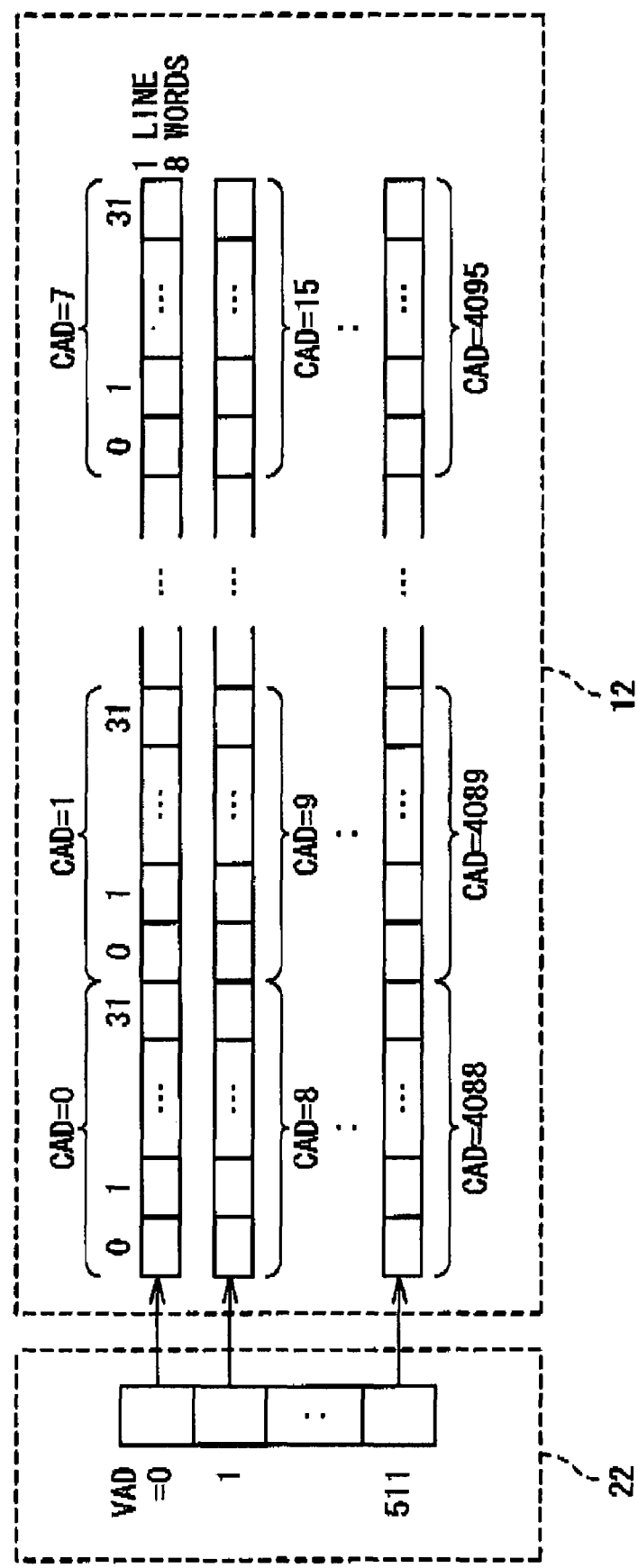
FIG. 3 is a view for describing correspondence between a cache memory and a valid bit memory.

FIG. 3 shows the correspondence between the cache memory 12 and the valid bit memory 22. The cache memory 12 is accessed from the CPU in a unit of the word. Here, 1 word consists of 32 bits. The interface to the outside is performed in a unit of the line. Here, 1 line consists of 8 words. The valid bit is assigned to each line. Accordingly, when the valid bit memory 22 is a memory having the 1 bit/word configuration, as shown in FIG. 3, the cache memory 12 of 4096 words requires the valid bit memory 22 of 512 words (bits).

Power is supplied to the cache memory 12 and the valid bit memory 22 from a power supply system Vm other than a power supply system for the other circuits. Thus, after data representing the internal state of the CPU are saved in the cache memory 12 through the scan chains 300 to 331, only the power supply system Vm supplies power and the power supply for the other circuits stops supply, thereby enabling reduction in power consumption of the semiconductor integrated circuit apparatus.

The control circuit portion 50 includes a state flag creation portion 54, a scan enable creation portion 55, a valid data creation portion 56, a count portion 52 and a memory control signal creation portion 58. When a saving mode signal SMD of instructing a saving operation and a recovery mode signal RMD of instructing a recovery operation are supplied to the control circuit portion 50, the control circuit portion 50 feeds a control signal corresponding to each operation mode to each portion. A clock CLK not shown in detail is fed to each portion and the control circuit portion 50 operates in synchronization with the clock CLK.

The state flag creation portion 54 creates a data protection state flag PFL on the basis of the saving mode signal SMD or the recovery mode signal RMD. The data protection state flag PFL is fed to the selection circuits 81, 82 and 83 to switch each signal to be fed to the cache memory 12, the valid bit memory 22 and the scan chains 300 to 331.

The scan enable creation portion 55 creates the protecting scan enable signal PSE of making the shift operation of the scan chains 300 to 331 valid. The protecting scan enable signal PSE is fed to the scan flip-flops F0-0 to F0-255, ..., F31-0 to F31-255 through the OR circuit 87. When the protecting scan enable signal PSE is active, the scan chains 300 to 331 perform the shift operation in synchronization with the clock CLK. The protecting scan enable signal PSE becomes active at start of the saving operation. However, since data read from the cache memory 12 are delayed by 1 clock at the recovery operation, the protecting scan enable signal PSE becomes active with a delay of 1 clock from start of the recovery operation. When all data are saved or recovered, the protecting scan enable signal PSE becomes inactive, thereby preventing unnecessary shift.

The valid data creation portion 56 creates a valid data signal XVDI written to the valid bit memory 22. The valid data signal XVDI becomes a valid bit memory input data signal VDI through the selection circuit 81. Thus, at the saving and recovery operations, the valid bit memory input data signal VDI corresponds to the valid data signal XVDI created by the valid data creation portion 56. The valid data creation portion 56 feeds only the data "0" representing that the data in the cache memory 12 are "invalid".

The count portion 52 includes a counter for performing counting on the basis of the clock CLK and creates an address signal XCAD of the cache memory 12 and an address signal XVAD of the valid bit memory 22. When the cache memory 12 is a memory of 4096 words, the counter can represent an address in 12 bits and higher-order 9 bits of the 12 bits represents the address of the valid bit memory 22. In the present embodiment, since the internal state data are sequentially stored in the memory corresponding to the address, a count value CNT of this counter corresponds to the number of pieces of the saved data through the scan chains. Thus, since the count value CNT clarifies end of the scan chains for the saving and recovery, the count portion 52 detects the end and informs the end to each portion. The count value CNT may be informed to each portion.

The memory control signal creation portion 58 creates chip select signals XCCS, XVCS representing that the cache memory 12 or the valid bit memory 22 is selected, and write enable signals XCWE, XVWE of instructing write/read state of data in each memory. The chip select signal XCCS and the write enable signal XCWE are fed to the cache memory 12 through the selection circuit 82 as the chip select signal CCS and the write enable signal CWE, respectively. The chip select signal XVCS and the write enable signal XVWE are fed to the valid bit memory 22 through the selection circuit 81 as the chip select signal VCS and the write enable signal VWE, respectively. Consequently, at the saving and recovery operations of the internal state data, the chip select signals CCs and VCS and the write enable signals CWE and VWE which are each supplied to the corresponding memory corresponds to the chip select signals XCCS, XVCS and the write enable signals XCWE, XVWE, respectively, which are created by the memory control signal creation portion 58.

At the time of saving, since data of the scan chains 300 to 331 are sequentially written from the head of the cache memory 12, the write enable signals CWE and VWE represent the write state (write) at all times. At the time of recovery, since only the internal state data are read from the cache memory 12, the write enable signals CWE and VWE represent the read state (read) at all times. The chip select signal CCS of the cache memory 12 becomes active at the saving operation or the recovery operation. Since the valid bit memory 22 is not accessed during the recovery operation, the chip select signal VCS of the valid bit memory 22 becomes active only during the saving operation.

Figure 4:
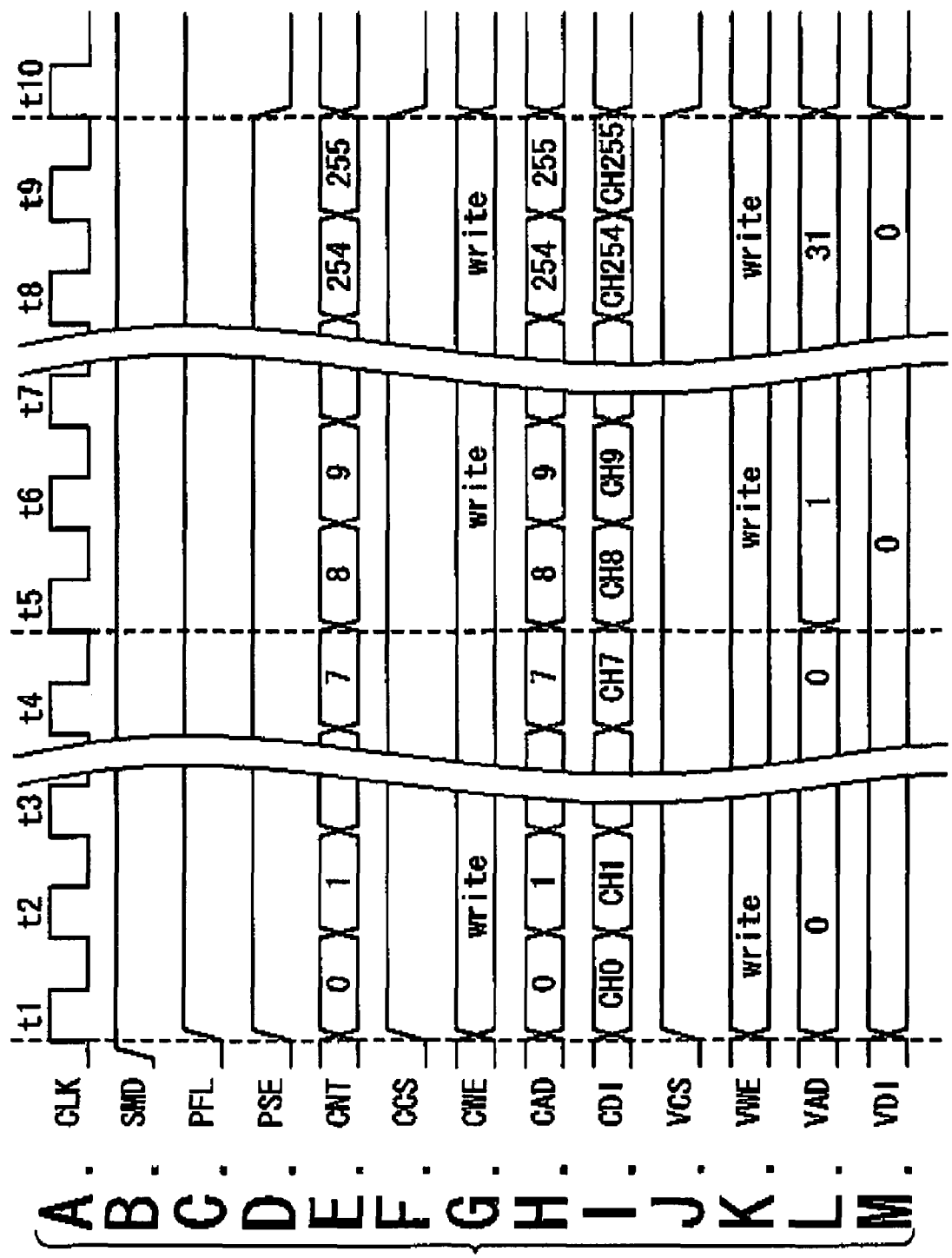
FIGS. 4A to 4M are timing charts for describing a saving operation in accordance with the first embodiment.

Next, referring to FIGS. 4A to 4m, the saving operation of saving data representing the internal state in the cache memory 22 will be described. FIG. 4A shows the clock CLK and a reference letter is assigned to each cycle. Since the circuits are operated in synchronization with the clock CLK, timing is described using these reference letters. Thus, a clock t1 represents a cycle t1 of the clock CLK.

When the saving mode signal SMD indicating the instruction of the saving operation supplied from the outside becomes active (FIG. 4B), the saving operation is started and the data protection state flag PFL and the protecting scan enable signal PSE become active. Since then, the data protection state flag PFL continues to be in the active state, that is, the state where the selection circuits 81 to 83 are switched to the saving operation side until the saving operation is finished (FIG. 4C). Until a clock t9 when the scan chains 300 to 331 output the data representing all internal state, the protecting scan enable signal PSE continues to be in the active state so that the scan chains 300 to 331 may perform the shift operation (FIG. 4D).

Accordingly, in the period t1, the chip select signal CCS of the cache memory 12 and the chip select signal VCS of the valid bit memory 22 become active (FIGS. 4F and 4J) and the write enable signals CWE and VWE of these memories each become the write state (FIGS. 4G and 4K). Thereby, the cache memory 12 can store the data representing the internal state, which are output from the scan chains 300 to 331, and the valid bit memory 22 can make the valid bits "invalid". The count value CNT of the counter provided at the count portion 52 becomes "0" (FIG. 4E) and both the address signal CAD of the cache memory 12 and the address signal VAD of the valid bit memory 22 become "0" (FIGS. 4H and 4L). Accordingly, the first data CH0 of the scan chains 300 to 331, that is, the data representing the internal state stored in the scan flip-flops F0-0 to F31-0 are set at an address 0 of the cache memory 12 (FIG. 4I), and "0" indicating "invalid" is rewritten to an address 0 of the valid bit memory 22 (FIG. 4M).

At a clock t2, the count value CNT is incremented to "1" (Fig, 4E). Thus, the address CAD of the cache memory 12 becomes "1" (FIG. 4H), while the address VAD of the valid bit memory 22 does not change (FIG. 4L). Since the protecting scan enable signal PSE is active, the scan chains 300 to 331 performs the shift operation at each rising edge of the clock CLK and moves the data representing the internal state to the scan flip-flops F0-0 to F31-0. Thus, at the clock t2, the data CH1 are given to the cache memory 12 (FIG. 4I). Up to a clock t4, at each clock, the scan chains 300 to 331 repeat the shift operation and thus, the data representing the internal state are sequentially written to the cache memory 12. At the clock t4, the count value CNT becomes "7", which means that data for 1 line of the cache memory 12 are written.

At a clock t5, the count value CNT becomes "8" (FIG. 4E) and the address of the valid bit memory 22 becomes "1" (FIG. 4L). The data "0" indicating "invalid" is written to the address "1" of the valid bit memory 22 (FIG. 4M) and the data CH8 of the scan chain are written to the address "8" of the cache memory 12 (FIG. 4I). In this manner, at each clock, the address CAD of the cache memory 12 is updated and data of the scan chains 300 to 331 are sequentially stored in the cache memory 12.

At a clock t8, data CH254 are written to the cache memory 12 and at the clock t9, final data of the scan chains 300 to 331, that is, data CH255 stored in the scan flip-flops F0-255 to F31-255 are written to the cache memory 12. Since all data indicating the internal state are saved in the cache memory 12, at the clock t10, the protecting scan enable signal PSE becomes inactive and the chip select signals CCS and VCS of the cache memory 12 and the valid bit memory 22 become inactive (FIGS. 4D, 4F and 4J).

As described above, all of the data indicating the internal state, which are stored in the scan flip-flops F0-0 to F0-255, . . . , F31-0 to F31-255, are saved and held in the cache memory 12. By continuing power supply to the cache memory 12 and the valid bit memory 22, even when the power supply to the CPU is stopped, the internal state of the CPU is maintained.

Figure 5:
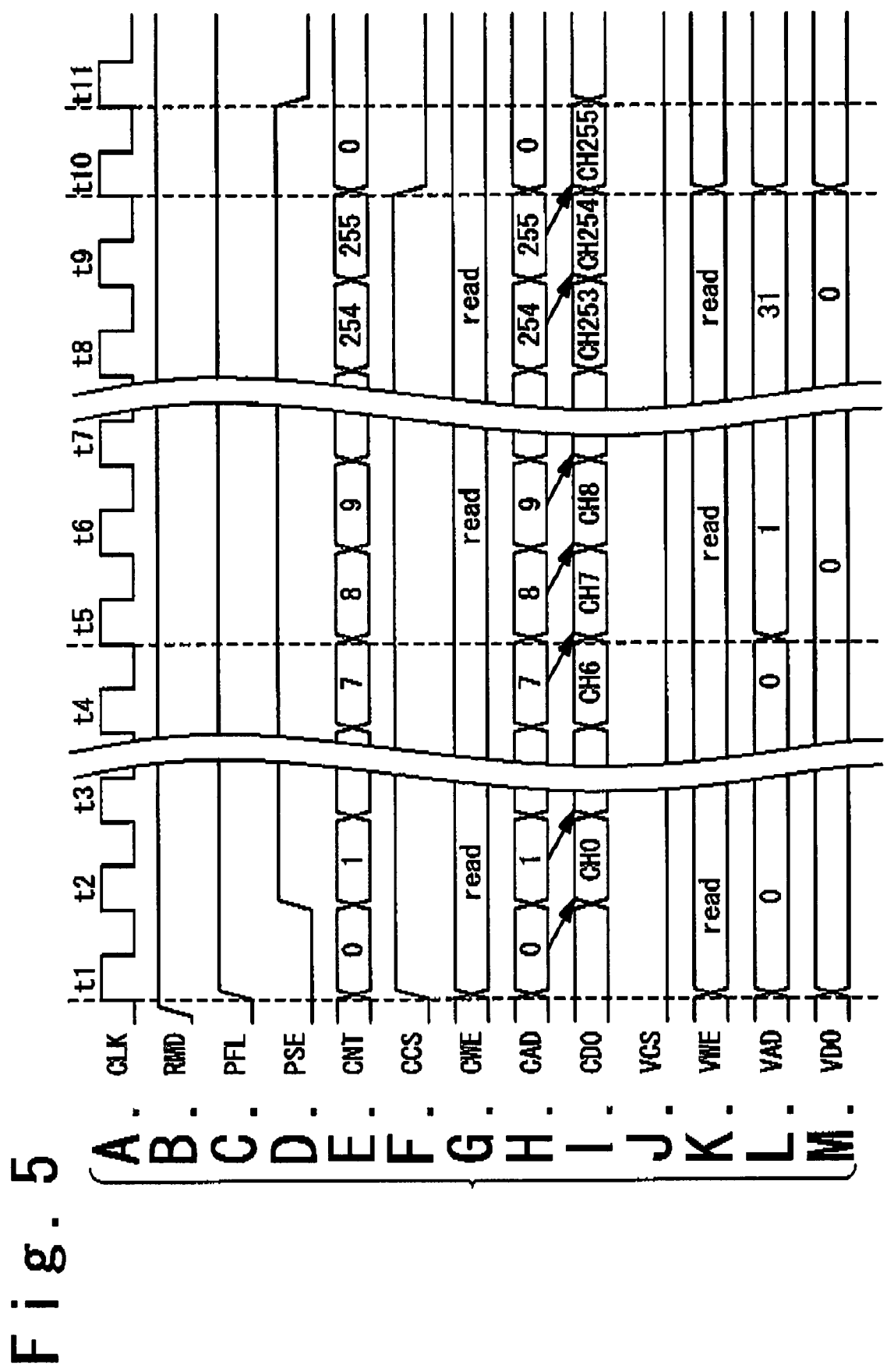
FIGS. 5A to 5M are timing charts for describing a recovery operation in accordance with the first embodiment.

Next, referring to FIGS. 5A to 5M, the recovery operation of resetting the internal state data of the CPU stored in the cache memory 12 to the original scan flip-flops will be described. FIG. 5A shows the clock CLK and a reference letter is assigned to each cycle. Since the recovery operation is performed in synchronization with the clock CLK, timing is described using these reference letters.

When the recovery mode signal RMD instructing the recovery operation from the outside becomes active (FIG. 5B), the recovery operation is started and the data protection state flag PFL becomes active (FIG. 5C). Since then, the data protection state flag PFL continues to be in the active state until the recovery operation is finished to switch the selection circuits 81 to 83 to the recovery operation side. Since the data read from the cache memory 12 are output with a delay from address supply by 1 clock, the protecting scan enable signal PSE becomes active at the clock t2 delayed with respect to the data protection state flag PFL by 1 clock. The protecting scan enable signal PSE continues to be in the active state so that the scan chains 300 to 331 may perform the shift operation during the period between the output of all data indicating the internal state from the cache memory 12 and resetting of the data to the original scan chains 300 to 331 at a clock t10 (FIG. 5D).

Accordingly, in the period t1, the chip select signal CCS of the cache memory 12 becomes active and the chip select signal VCS of the valid bit memory 22 becomes inactive (FIGS. 5F and 5J) and the write enable signal CWE of the cache memory 12 becomes the read state (FIG. 5G). Thereby, the data representing the internal state in the cache memory 12 can be read out, while the data in the valid bit memory 22 can not be read out.

When the counter of the count portion 52 starts counting at the same time when the data protection state flag PFL becomes active and at the clock t1, becomes an initial value "0". This counter counts up in synchronization with the rising edge of the clock CLK to "255" corresponding to length of the scan chains 300 to 331 (FIG. 5E). The count value CNT is given to the cache memory 12 as the address CAD and the address CAD is incremented in synchronization with the rising edge of the clock CLK (FIG. 5H). Higher-order 5 bits of the count value CNT are given to the valid bit memory 22 as the address signal VAD. Since the valid bit memory 22 is not accessed during the recovery operation, the address signal VAD is not used (FIG. 5L).

The write enable signal CWE of the cache memory 12 instructs a reading operation (FIG. 5G). The cache memory 12 outputs the data CH0 at the address "0" instructed at the clock t1 to the output signal CDO at the clock t2 and the data are supplied to the scan chains 300 to 331 (FIG. 5I). The scan chains 330 to 331 shift from the scan flip-flops F0-255 to F31-255 toward the scan flip-flops F0-0 to F31-0 in synchronization with the rising edge of the clock CLK. The data CHO are supplied to the scan flip-flops F0-255 to F31-255 and moves to the scan flip-flops F0-254 to F31-254 at the clock t3. The internal state data are read from the cache memory 12 at each clock, are supplied to the scan flip-flops F0-255 to F31-255 and moves through the scan chains 300 to 331.

At the clock t9, the count value CNT becomes "255" (FIG. 5E) and the address CAD of the cache memory 12 becomes the final address "255" at which saved data are stored (FIG. 5H). Data CH255 corresponding to this address are output from the cache memory 12 at the clock t10 (FIG. 5I). The scan chain 300 to 331 performs the last shift operation. Thereby, the data CH255 are reset in the scan flip-flops F0-255 to F31-255 and the recovery operation is finished. Here, the addresses of the cache memory in which the internal state data is saved are "0" to "255". However, by setting the initial value of the counter, the address may be started from any address.

As described above, the internal state data of the CPU are saved in the cache memory 12 and reset in the original scan flip-flops. Accordingly, even when the CPU is put into the waiting state and power supply is stopped after saving of the internal state, the operation can be restarted at high speed. Since the area of the cache memory 12 where the internal state data are not written is kept to be in the state prior to saving, it is expected that the operation after recovery is almost the same as that before waiting. Because of use of the cache memory 12, a separate memory for holding the internal state data therein need not be provided.

Second Embodiment

Figure 6:
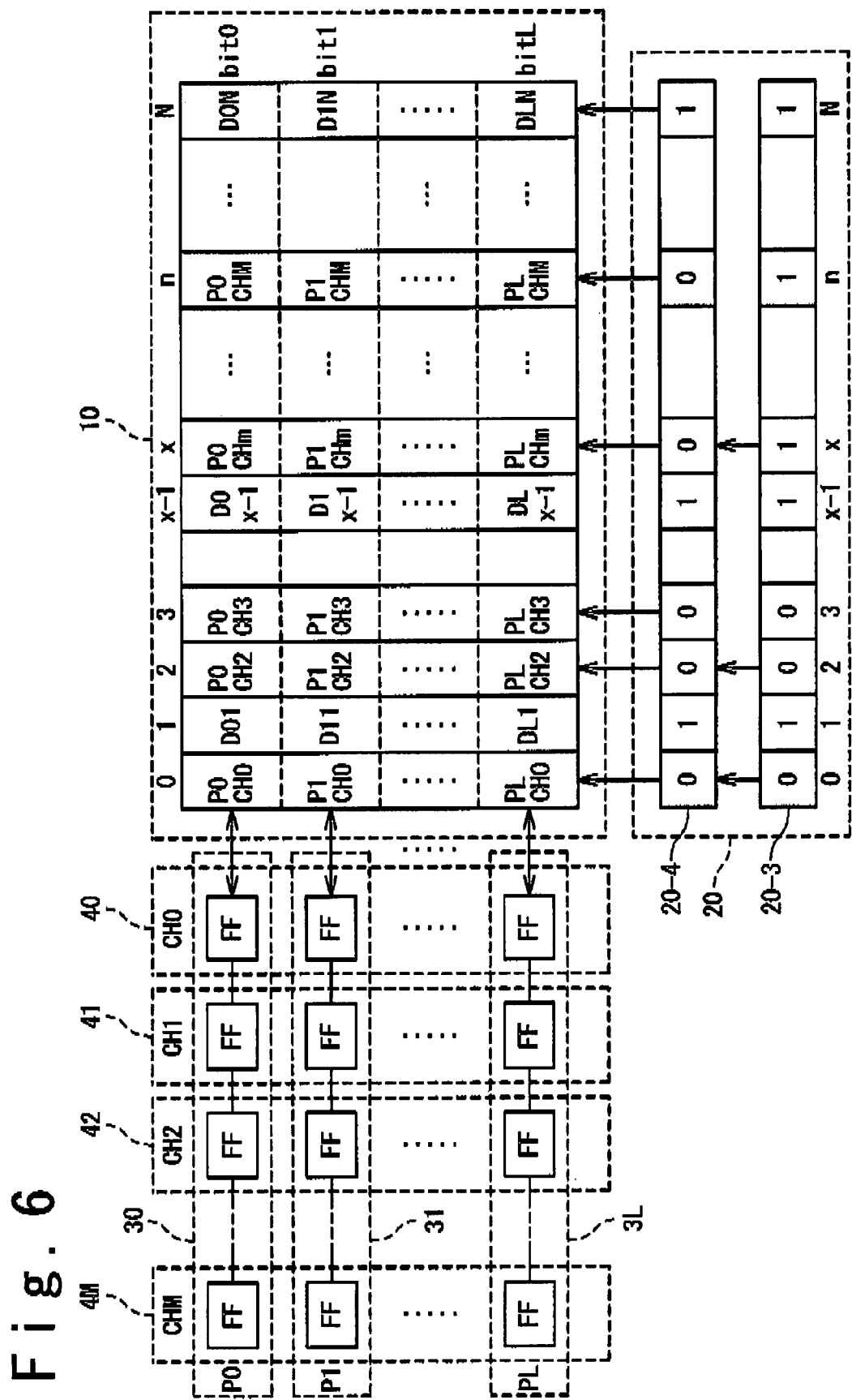
FIG. 6 is a schematic view for describing a second embodiment of the present invention.

Referring to figures, a second embodiment of the present invention will be described. FIG. 6 is a schematic view showing scan chains, a cache memory and a valid bit memory which are built in a semiconductor integrated circuit apparatus to explain the second embodiment. The semiconductor integrated circuit apparatus includes the cache memory 10, the valid bit memory 20 which stores valid bits representing validity of data stored in the cache memory 10 therein and scan flip-flop groups which hold the internal state data of the semiconductor integrated circuit apparatus therein. The cache memory 10 is a memory of (N+1) words×(L+1) bits/word. The valid bits representing validity of the data stored in each word of the cache memory 10 are stored in the valid bit memory 20. Here, 1 bit is assigned to 1 word of the cache memory 10. Thus, the valid bit memory 20 stores information of (N+1) bits therein.

Data representing the internal state of the semiconductor integrated circuit apparatus are held in scan flip-flops. At the time of saving of the internal state data, the scan flip-flops form the scan chain 30, 31, . . . , 3L and serially output the held internal state data through the scan chains 30, 31, . . . , 3L. At the time of recovery, the scan flip-flops reset the saved internal state data through the scan chains 30, 31, . . . , 3L. The scan chains 30, 31, . . . , and 3L as serial I/O input or output the internal state data in sequence according to a synchronous clock. At the time of output, data of (L+1) bits is output in parallel in the order of the scan flip-flop group 40 (stored data are referred to as CH0) which are connected to output nodes, a scan flip-flop group 41 (CH1), a scan flip-flop group 42 (CH2) . . . , a scan flip-flop group 4M (CHM).

Initially, as shown in a content 20-3 of the valid bit memory, the valid bit memory 20 indicates that data at addresses 1, . . . , x−1, x, . . . , n, . . . , N are "valid (=1)" and data at addresses 0, 2, 3, . . . are "invalid (=0)". In the second embodiment, the internal state data are stored in invalid data area where the contents of the cache memory 10 are "invalid", That is, the internal state data are stored at the addresses 0, 2, 3, . . . of the cache memory 10. There is no problem when all internal state data can be stored in unused area of the addresses 0, 2, 3, . . . . However, there are some cases that the unused area is insufficient. When there is small unused area in the cache memory 10, the shortage is compensated by storing some of the internal state data in a predetermined area where the contents are "valid" and making the valid bits in the area "invalid".

In FIG. 6, since all the internal state data cannot be stored in the invalid data area up to an address (x−1), remaining internal state data are stored in the area from an address x to an address n and the valid bits are rewritten to "invalid (=0)". Therefore, as shown in a content 20-4, "0" is stored at the addresses x to n of the valid bit memory 20 and from the internal state data P0CHm-PLCHm to the internal state data P0CHM-PLCHM are stored at the corresponding addresses x to n of the cache memory 10. Data D01, D11, . . . , DL1 are stored at the address 1, data D0x−1, D1x−1, DLx−1 are stored at the address x−1 and data D0N, D1N, . . . , DLN are stored at an address N, all having the valid bit of 1, without being changed.

It means that the internal state data are stored in the area of the cache memory where the valid bit is "invalid". Thus, when the data are recovered, the internal state data can be reset in the original scan flip-flops by sequentially feeding data of the cache memory 10, of which the valid bits are "invalid", to the scan chains 30, 31, . . . , 3L and shifting the data through the scan chains. That is, the internal state data read from the cache memory 10 are fed toward the scan flip-flop group 4M side and shifts through the scan chain, and when (M+1) pieces of data are supplied, the initially read data P0CH0 to PLCH0 is reset in the scan flip-flop group 40.

Figure 7:
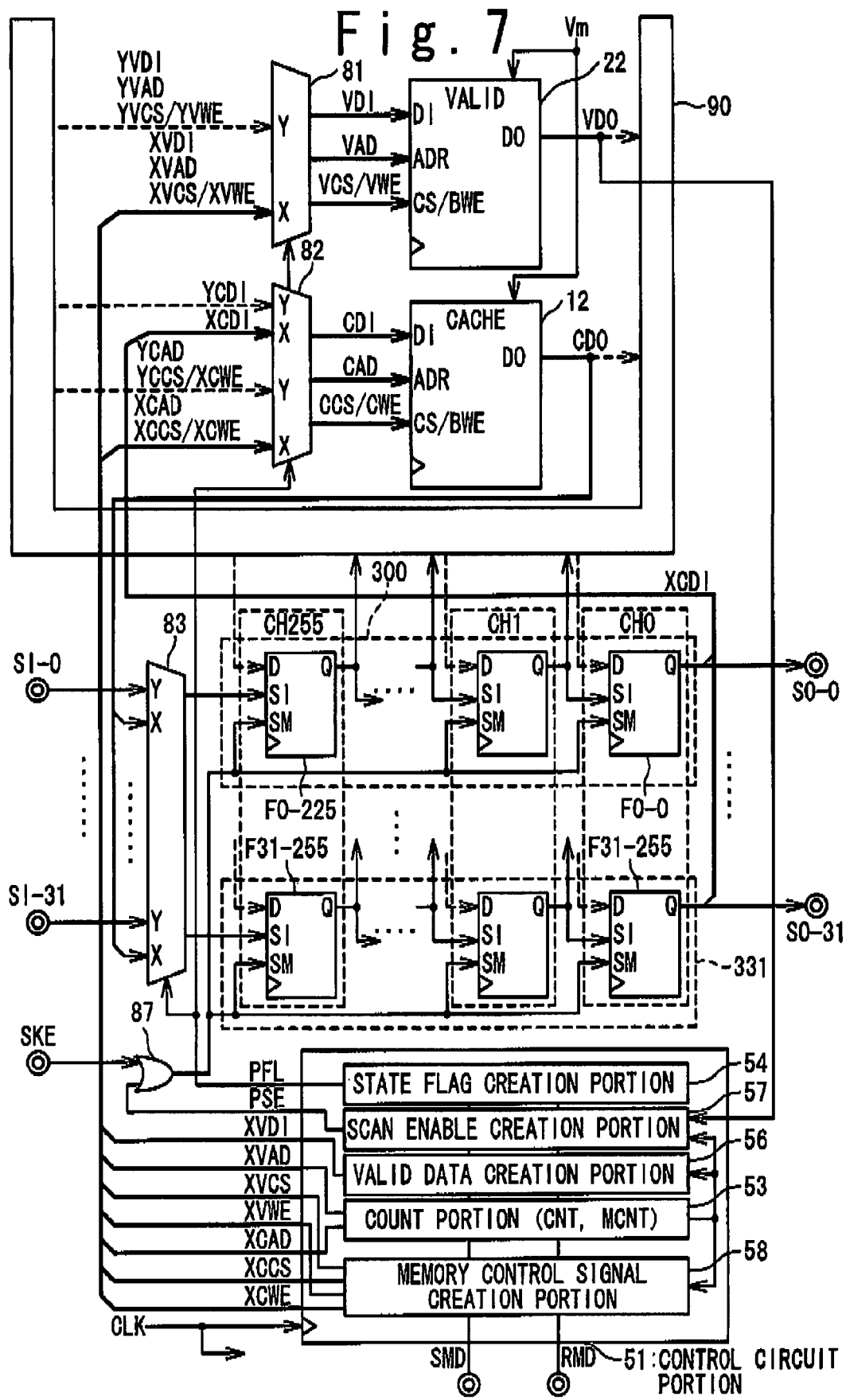
FIG. 7 is a block diagram showing configuration of a semiconductor integrated circuit in accordance with the second embodiment of the present invention.

FIG. 7 is a block diagram showing configuration of the semiconductor integrated circuit apparatus according to the second embodiment. The semiconductor integrated circuit apparatus has the substantially same configuration as the semiconductor integrated circuit apparatus as shown in FIG. 2. To determine the valid bit, the output of the valid bit memory 22 is fed to the control circuit portion 51 and the control circuit portion 51 has additional functions such as determination of the valid bit and counting of the number of pieces of the internal state data.

The semiconductor integrated circuit apparatus includes the internal logic circuit portion 90, the cache memory 12, the valid bit memory 22, the selection circuits 81, 82 and 83, the OR circuit 87, the control circuit portion 51 and the scan flip-flops F0-0 to F0-255, . . . , F31-0 to F31-255. The internal logic circuit portion 90 and the scan flip-flops F0-0 to F0-255, . . . , F31-0 to F31-255 are circuits operating as, for example, CPU during the normal operation. Hereinafter, the circuits formed of the internal logic circuit portion 90 and the scan flip-flops F0-0 to F0-255, . . . , F31-0 to F31-255 are regarded as the CPU. In the scan test of testing normality of the circuit operation, the scan flip-flops F0-0 to F0-255, . . . , F31-0 to F31-255 form the scan chains 300 to 331. The scan input signals SI-0 to SI-31 as serial test data are supplied from the input ports. Serial scan output signals SO-0 to SO-31 as test results are output from the output ports.

According to the present invention, using the scan chains, the data representing the internal state of the semiconductor integrated circuit apparatus are saved and recovered. For this reason, the selection circuits 81, 82 and 83 switch normal data, test data and internal state data of the semiconductor integrated circuit apparatus. The selection circuit 81 switches the address signal VAD, the input data signal VDI and the memory control signals VCS/VWE such as chip select and write enable signals, which are supplied to the valid bit memory 22. The selection circuit 82 switches the address signal CAD, the input data signal CDI and memory control signals CCS/CWE such as the chip select and the write enable signals, which are supplied to the cache memory 12. The selection circuit 83 switches serial signals supplied to the scan chains 300 to 331. The scan chains 300 to 331 fetch the scan test data supplied from the outside or the internal state data stored in the cache memory 12. Thus, the selection circuit 83 switches the scan input signals SI-0 to SI-31 and the output signal CDO of the cache memory 12 and feeds them as serial inputs of the scan chains 300 to 331.

The OR circuit 87 performs the logical OR operation between the external scan enable signal SKE of instructing the shift operation of the scan chain at the scan test and the protecting scan enable signal PSE created by the control circuit portion 51, and feeds the logical OR to each scan flip-flop, thereby allowing each scan flip-flop to perform the scan chain operation (shift operation).

The cache memory 12 is accessed from the CPU formed of the internal logic circuit portion 90 and the scan flip-flops F0-0 to F0-255, . . . , F31-0 to F31-255. The cache memory 12 is a high-speed memory provided for reducing access to an external main memory to speed up processing. The valid bits representing whether the content is valid or invalid are stored in the valid bit memory 22. Since correspondence between the cache memory 12 and the valid bit memory 22 is shown in FIG. 3 as described in the first embodiment, description thereof is omitted here.

Power is supplied to the cache memory 12 and the valid bit memory 22 from the power supply system Vm other than a power supply system for the other circuits. Thus, after data representing the internal state of the CPU are saved in the cache memory 12 through the scan chains 300 to 331, only the power supply system Vm supplies power and the power supply for the other circuits stops supply, thereby enabling reduction in power consumption of the semiconductor integrated circuit.

The control circuit portion 51 includes the state flag creation portion 54, a count portion 53, a scan enable creation portion 57, the valid data creation portion 56 and the memory control signal creation portion 58. When a saving mode signal SMD of instructing the saving operation and a recovery mode signal RMD of instructing the recovery operation are supplied to the control circuit portion 51, the control circuit portion 51 feeds a control signal corresponding to each operation mode to each portion. A clock CLK not shown in detail is fed to each portion and the control circuit portion 51 operates in synchronization with the clock CLK.

The state flag creation portion 54 creates a data protection state flag PFL on the basis of the saving mode signal SMD and the recovery mode signal RMD. The data protection state flag PFL is fed to the selection circuits 81, 82 and 83 to switch each signal to be fed to the cache memory 12, the valid bit memory 22 and the scan chains 300 to 331.

The count portion 53 includes a first counter (not shown) for counting the number of cycles of the clock CLK, a second counter (not shown) for counting the number of pieces of saved and recovered internal state data and a third counter (not shown) for counting an address where the internal state data are firstly written to the cache memory 12 in which the valid data are valid. In the case where the cache memory 12 is a memory of 4096 words, an address can be expressed by 12 bits. Thus, the first counter is a counter of 12 bits and higher-order 9 bits of 12 bits represents the address of the valid bit memory 22. Since the valid bit data are read from the valid bit memory 22, the contents of the read data are determined and then the writing or reading operation is performed to the cache memory 12, the address of the cache memory 12 is fed to the cache memory 12 with a delay of the count value of the first counter by two clocks. Consequently, the address update timing of the valid bit memory 22 is advanced from the address update timing of the cache memory 12 by two clocks. The count value CNT of the first counter serves as a base for the control circuit portion 51.

The second counter counts up when the internal state data are written to the cache memory 12 or the internal state data are read from the cache memory 12, and the count value CCNT represents the number of times of shifts in the scan chains 300 to 331. The count value is used for determining whether or not the saving or recovery operation of the internal state data is finished.

To store all the internal state data up to the predetermined address of the cache memory 12, the third counter is a counter of showing the first address where the internal state data needs to be written in the area in which the valid bits are "valid". At each valid bid, it is determined whether or not the internal state data are written. The count value MCNT represents the address of the valid bit memory 22. A value obtained by subtracting the length of the scan chains 300 to 331 from the predetermined address is set as the initial value of the third counter. Each time when the valid bit is determined and determination is made that the internal state data are written to the cache memory 12, the third counter counts up. For example, to store data of the scan chain having length of 256 words at the address less than the address 1023, an area from the address 768 to the address 1023 should be ensured. Since the address of the valid bit memory 22 is counted in the unit of 8 words in the cache memory 12, 768/8=96 becomes the initial value of the third counter. When a value MCNT of the third counter corresponds to the address of the valid bit memory 22, the internal state data are stored in the cache memory 12 corresponding to the position. When the valid bit is "invalid" in the area up to the address 768 of the cache memory 12 and the internal state data can be written, the third counter counts up and the ensured area is made smaller. When the invalid data area in which the valid bit is "invalid" is ensured for 256 words up to the address 1023, the internal state data is not written to a valid data area in which the valid bit is "valid".

The scan enable creation portion 57 creates the protecting scan enable signal PSE for making the shift operation of the scan chains 300 to 331 valid. The valid bit data VDO is fed from the valid bit memory 22 to the scan enable creation portion 57. The protecting scan enable signal PSE is fed to the scan flip-flops F0-0 to F0-255, ..., F31-0 to F31-255. When the protecting scan enable signal PSE is active, the scan chains 300 to 331 perform the shift operation in synchronization with the clock CLK. Since the internal state data are stored in the invalid data area in which the valid bit of the cache memory 12 is "invalid", the scan chains 300 to 331 perform the shift operation only at this time.

At the time of the saving operation, the scan enable creation portion 57 determines whether the valid bit read from the valid bit memory 22 is valid or invalid. When the valid bit is "invalid", the protecting scan enable signal PSE is made active, thereby allowing the scan chains 300 to 331 to perform shift operation. At the time of recovery operation, the scan enable creation portion 57 determines whether the valid bit read from the valid bit memory 22 is valid or invalid. When the valid bit is "invalid", the protecting scan enable signal PSE is made active, thereby allowing the scan chains 300 to 331 to perform shift operation. When the valid bit is "valid", since the data read from the cache memory 12 is not the internal state data, the data is not supplied to the scan chain 300 to 331. Thus, at the time of the recovery operation, the protecting scan enable signal PSE is delayed by 2 clocks from start of reading of the valid bit and represents active or inactive. When all data are saved or recovered, the protecting scan enable signal PSE becomes inactive, thereby preventing unnecessary shift.

The valid data creation portion 56 creates the valid data signal XVDI written to the valid bit memory 22. In the present embodiment, the valid data creation portion 56 feeds only the data "0" representing that data in the cache memory 12 is "invalid". The valid data signal XVDI becomes the valid bit memory input data signal VDI through the selection circuit 81. Thus, at the time of saving and recovery operations of the internal state data, the valid bit memory input data signal VDI corresponds to the valid data signal XVDI created by the valid data creation portion 56.

The memory control signal creation portion 58 creates the chip select signals XCCS and XVCS which the cache memory 12 and the valid bit memory 22 are selected and write enable signals XCWE and XVWE which instruct the write/read state of data in each memory. The chip select signal XCCS and the write enable signal XCWE are fed to the cache memory 12 through the selection circuit 82 as the chip select signal CCS and the write enable signal CWE. The chip select signal XVCS and the write enable signal XVWE are fed to the valid bit memory 22 through the selection circuit 81 as the chip select signal VCS and the write enable signal VWE. Thus, at the saving and recovery operations of the internal state data, the chip select signals CCS, VCS and the write enable signals CWE, VWE which are supplied to the respective memories correspond to the chip select signals XCCS, XVCS, the write enable signals XCWE, XVWE which are created by the memory control signal creation portion 58.

At the time of saving, since the data of the scan chains 300 to 331 are written to designated area of the cache memory 12 depending on the state of the valid bit, the write enable signals CWE and VWE appropriately represent the read state (read) and the write state (write). The chip select signal CCS of the cache memory 12 is controlled so as to become active at the time of only writing of data in the saving operation and become active at the time of only reading of data in the recovery operation. The chip select signal VCS of the valid bit memory 22 is controlled so as to become active at the time of reading and writing of data.

Figure 8:
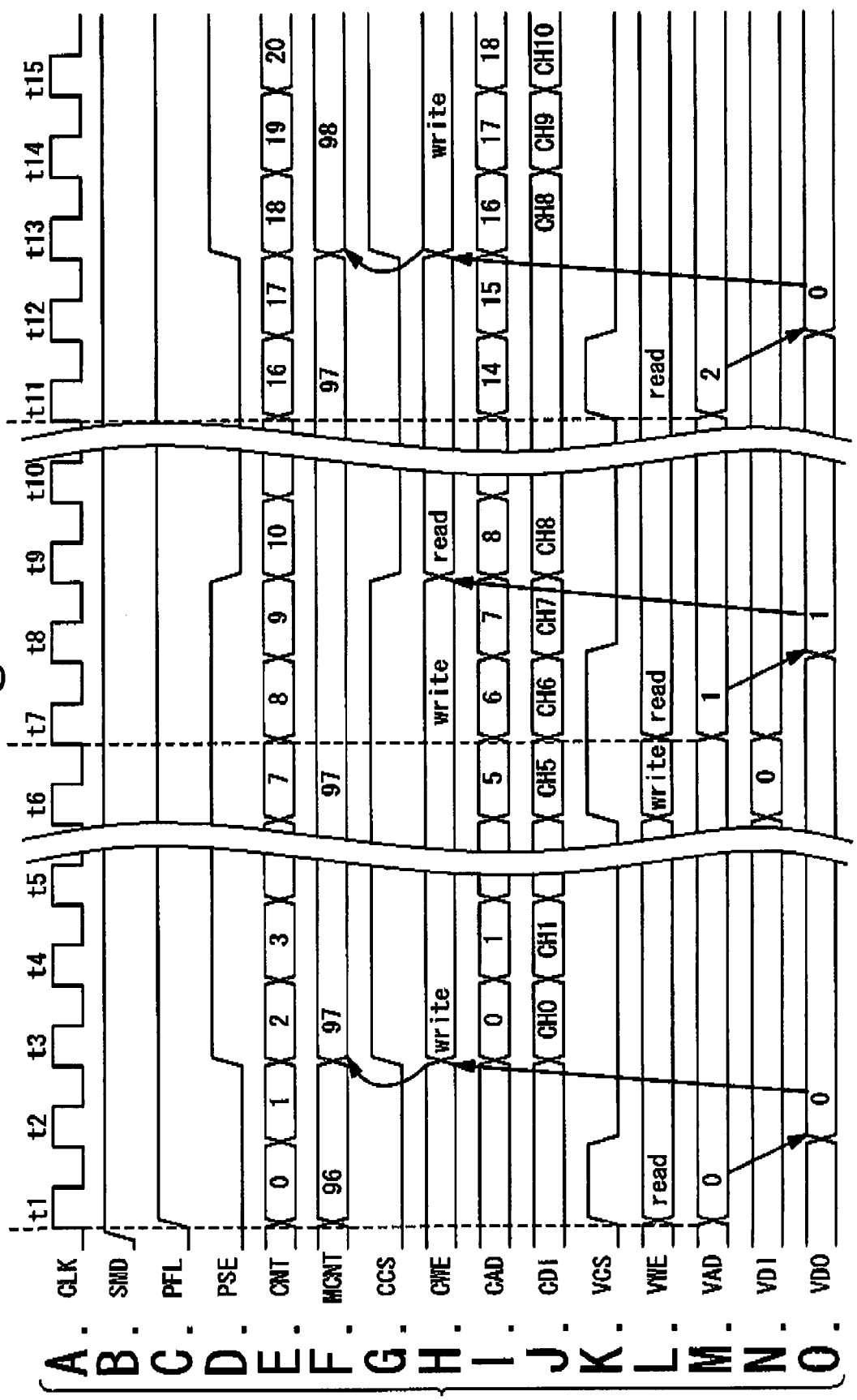
FIGS. 8A to 8O are timing charts (1) for describing a saving operation in accordance with the second embodiment.
Figure 9:
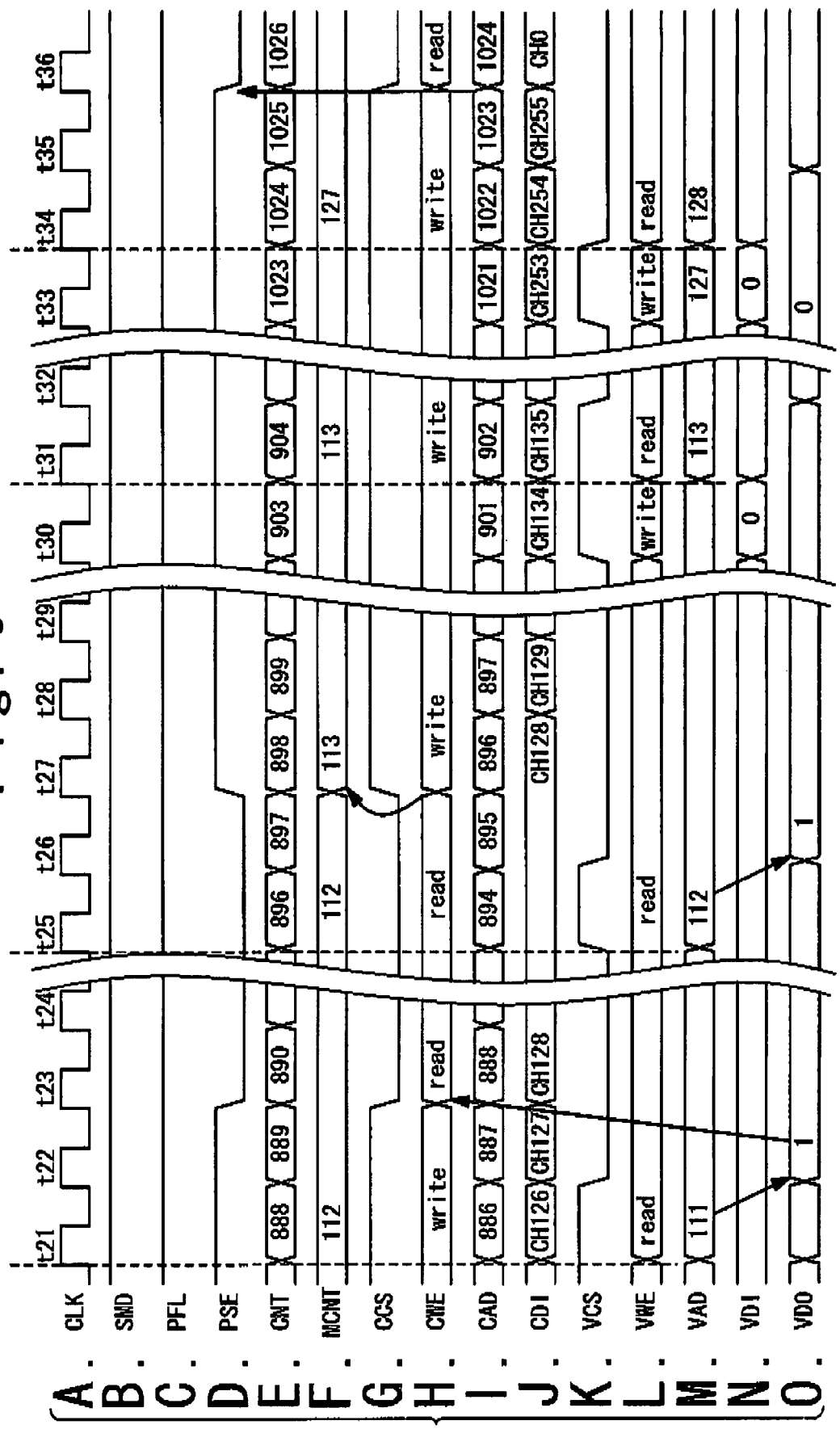
FIGS. 9A to 9O are timing charts (2) for describing the saving operation in accordance with the second embodiment.

Next, referring to FIGS. 8A to 8O and FIGS. 9A to 9O, the saving operation of storing data indicating the internal state in the cache memory 22 will be described. FIGS. 8A and 9A show the clock CLK and a reference letter is assigned to each cycle. Since the circuits are operated in synchronization with the clock CLK, timing is described sing these reference letters.

When the saving mode signal SMD instructing the saving operation from the outside becomes active (FIG. 8B), the saving operation is started and the data protection state flag PFL becomes active (FIG. 8C). Since then, the data protection state flag PFL continues to be in the active state to switch the selection circuits 81 to 83 to the saving operation side until the saving operation is finished (FIGS. 8C and 9C).

When the saving operation is started, the first counter of the count portion 53 starts counting. At the clock t1, the count value CNT of the first counter becomes "0" as the initial value (FIG. 8E) and the count value MCNT of the third counter becomes the initial value "96" (FIG. 8F). As described above, the count value MCNT is set as "96" so as to store all internal state data in the area less than the address 1024 of the cache memory 12. At the clock t1, the valid bit data is read from the valid bit memory 22. For this reason, the address signal VAD of the valid bit memory 22 becomes "0" shown by higher-order 9 bits of the count value CNT (FIG. 8M). The write enable signal VWE becomes the read state "read" (FIG. 8L), the chip select signal VCS becomes active (FIG. 8K). The valid bit stored at the address VAD=0 is read at the clock t2 (FIG. 8O). Since the valid bit is "0(=invalid)", it is determined that the area of 8 words of the address CAD "0" to "7" of the cache memory 12 can store the internal state data therein. Accordingly, preparation is made for writing of the internal state data to the cache memory 12 at the clock t3 or later.

At the clock t3, writing of the internal state data to the cache memory 12 is started. The chip select signal CSS of the cache memory 12 becomes active (FIG. 8G) and the write enable signal CWE becomes the write state "write" (FIG. 8H). The address CAD of the cache memory 12 is output with a delay of the count value CNT by two clocks and becomes "0" at the clock t3 (FIG. 8I). The protecting scan enable signal PSE becomes active (FIG. 8D), and the first data CH0 of the scan chains 300 to 331 is supplied and written to cache memory 12 (FIG. 8J). Since the internal state data are written to the cache memory 12, the third counter of the count portion 53 counts up and the count value MCNT becomes "97" (FIG. 8F).

At the clock t4, since the count value CNT becomes "3" and the address CAD of the cache memory 12 becomes "1" (FIGS. 8E and 8I). Since the protecting scan enable signal PSE is active, the scan chains 300 to 331 perform the shift operation and the internal state data CH1 is supplied and written to the cache memory 12 (FIG. 8J). This operation with respect to the cache memory 12 is repeated up to the clock t8.

When the internal state data is stored in the cache memory 12, at the clock t6, the valid bit "invalid" is written to the valid bit memory 22. The chip select signal VCS of the valid bit memory 22 becomes active (FIG. 8K) and the write enable signal VWE represents "write" (FIG. 8L). "0" is supplied to the valid bit memory 22 as the valid bit data VDI (FIG. 8N). Up to the clock t6, the address VAD of the valid bit memory 22 is "0" (FIG. 8M). This operation is carried out to unify the writing operation to the valid bit memory 22 and may be omitted when the valid bit is "0".

At the clock t7, the count value CNT is incremented to "8" (FIG. 8E) and the address VAD of the valid bit memory 22 becomes "1" (FIG. 8M). The chip select signal VCS remains to be active (FIG. 8K) and the write enable signal VWE becomes "read" (FIG. 8L).

At the clock t8, the valid bit is read from the valid bit memory 22 (FIG. 8O). Since the valid bit of the address VAD=1 is "1" (=valid), whether or not the data is stored in the corresponding cache memory 12 is determined depending on the result of comparison between the address VAD and the count value MCNT. At this time, since the address VAD is 1 (FIG. 8M) and the count value MCNT is 97 (FIG. 8F), the internal state data is not stored in the cache memory 12. Thus, at the clock t9, the write enable signal CWE of the cache memory 12 becomes "read" (FIG. 8H) and the chip select signal CCS becomes inactive. Furthermore, the protecting scan enable signal PSE becomes inactive (FIG. 8D) so as to stop shift of the scan chains 300 to 331. When no data is written to the cache memory 12, the count value CNT is updated in this state until the next valid bit determination.

At a clock t11, the valid bit is read and determined. At the clock t11, the count value CNT becomes "16" (FIG. 8E) and the address signal VAD of the valid bit memory 22 becomes "2" (FIG. 8M). The chip select signal VCS becomes active (FIG. 8K) and at a clock t12, "0" is output from the valid bit memory 22 (FIG. 8O). Since the internal state data can be stored in 8 words where the address CAD of the cache memory 12 is "16" to "23", at a clock t13, the chip select signal CCS of the cache memory 12 becomes active (FIG. 8G) and the write enable signal CWE is put into the "write" state (FIG. 8H). Data CH8 of the scan chain are written to the cache memory 12 (FIG. 8J). At the same time, the count value MCNT is incremented to represent "98" (FIG. 8F).

In this manner, the internal state data is sequentially stored in the area of the cache memory 12 in which the valid bit is "0". The count value MCNT is incremented each time the internal state data are written. However, the count value MCNT is not incremented when the valid bit is "1", a difference between the count value MCNT and the address VAD of the valid bit memory 22 gradually decreases. FIGS. 9A to 9O show the operation from the point when the difference substantially disappears.

At a clock t21, the count value CNT becomes "888" (FIG. 9E), the address signal VAD of the valid bit memory 22 becomes "111" and the valid data is read from the valid bit memory 22 (FIG. 9M). The count value MCNT becomes "112" (FIG. 9F). At a clock t22, the valid bit data "1" is output (FIG. 9O) and the data are held from the address 888 to the address 895 of the cache memory 12.

At a clock t25, the next valid bit is read. At the clock t25, the count value CNT becomes "896" (FIG. 9E) and the address signal VAD of the valid bit memory 22 becomes "112" (FIG. 9M). At a clock t26, although the valid bit output from the valid bit memory 22 represents "1" (FIG. 9O), since the address VAD (112) corresponds to the count value MCNT (112), it is determined that the internal state data needs to be written to the cache memory 12. Thus, during 8 clocks from a clock t27 to a clock t31, the internal state data are written to the cache memory 12. Accordingly, the count value MCNT is incremented to represent "113". The writing operation is carried out as described above. However, writing of the valid bit data "0" to the valid bit memory 22, which is performed at a clock t30 (FIGS. 9L and 9N), must be achieved. Thereby, the valid bit is changed from "1" to "0", which means that the original contents of the cache memory 12 are cancelled and the internal state data are written.

At the clock t25 or later, the address VAD of the valid bit memory 22 represents the same value as the count value MCNT. Thus, until all of the data of the scan chains 300 to 331 are saved in the cache memory 12, the data are written to the cache memory 12 irrespective of the state of the valid bit. At a clock t35, when last data CH255 of the scan chains 300 to 331 data written to the cache memory 12, the protecting scan enable signal PSE becomes inactive (FIG. 9D) and a series of saving operation is finished.

In this manner, the internal state data can be written to the area up to a predetermined address of the cache memory 12. It is assumed that the predetermined address is the final address of the cache memory 12, all of the invalid data areas of the cache memory 12 become areas in which the internal state data can be written. When the areas to be written are insufficient, an area close to the final address becomes the area to be written. Furthermore, as in the present embodiment, the internal state data can be saved by canceling the content of the cache memory 12 only in one area and holding the contents in the other areas.

Figure 10:
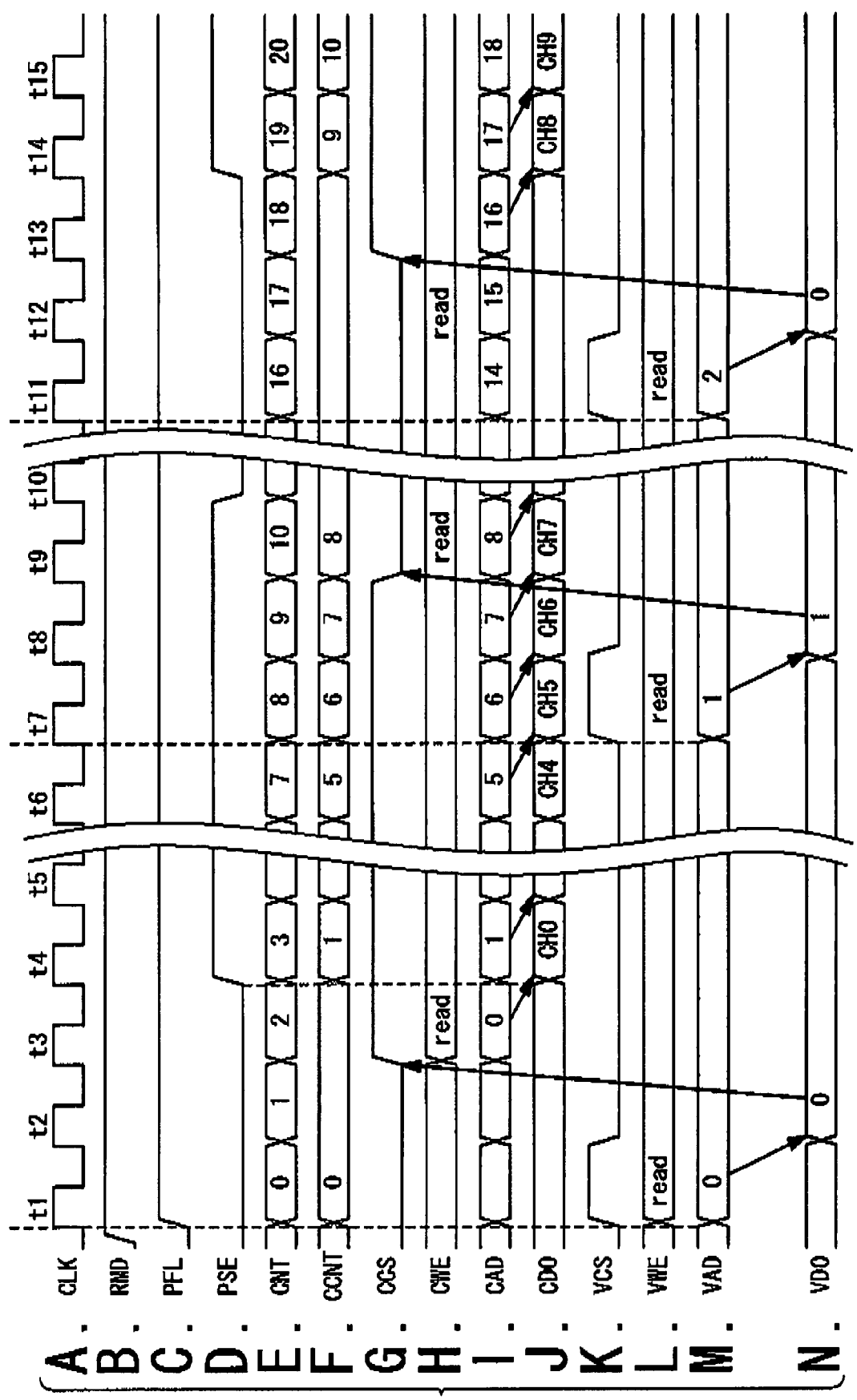
FIGS. 10A to 10N are timing charts (1) for describing a recovery operation in accordance with the second embodiment.
Figure 11:
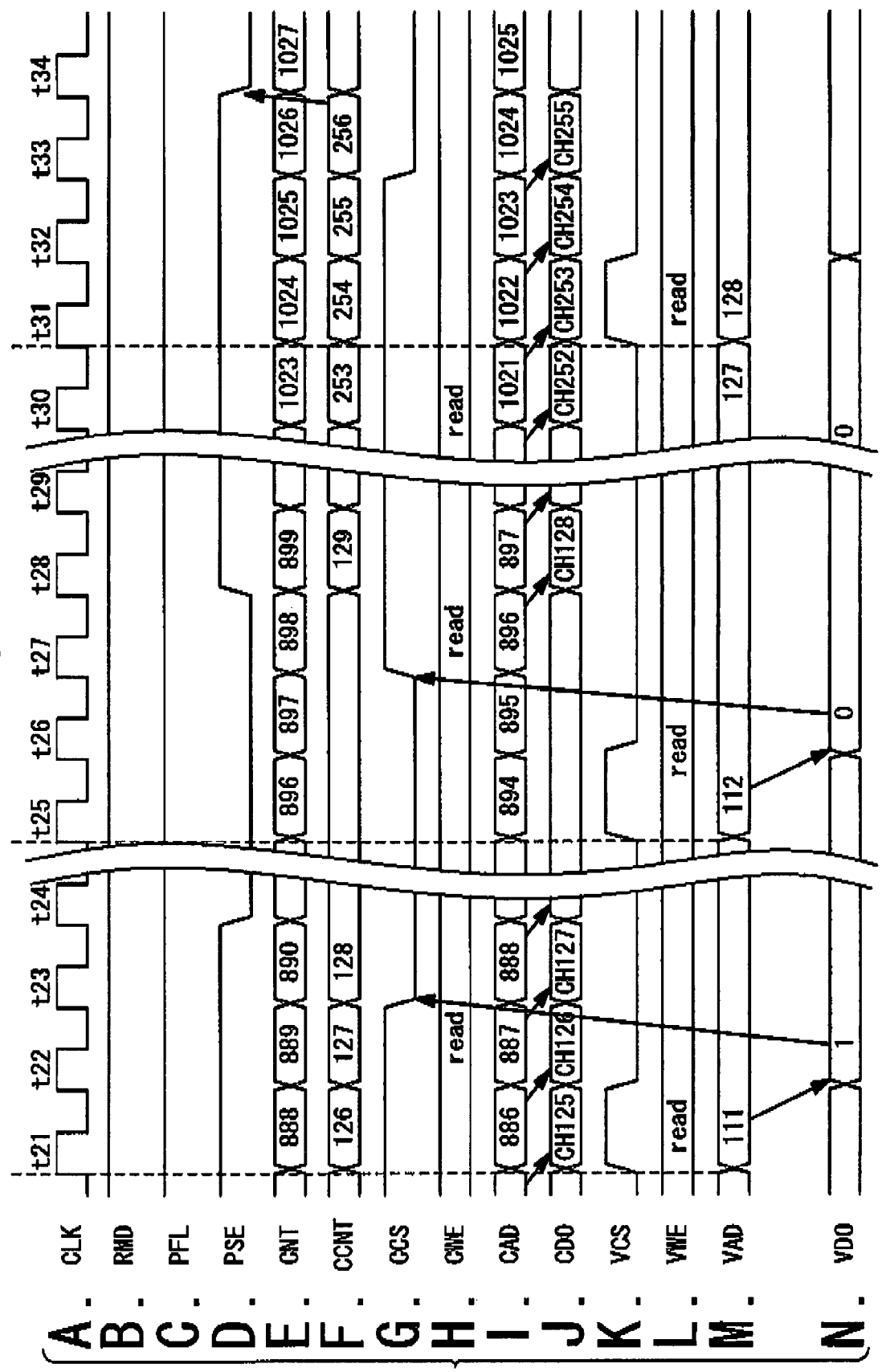
FIGS. 11A to 11N are timing charts (2) for describing a recovery operation in accordance with the second embodiment.

Next, referring to FIGS. 10A to 10N and 11A to 11N, the recovery operation of resetting the internal state data of the CPU in the cache memory 12 to the original scan flip-flops will be described. FIGS. 10A and 11A show the clock CLK and a reference letter is assigned to each cycle. Since the circuits are operated in synchronization with the clock CLK, timing is described using these reference letters.

When the recovery mode signal RMD instructing the recovery operation from the outside becomes active (FIG. 10B), the recovery operation is started and the data protection state flag PFL becomes active (FIG. 10C). Since then, the data protection state flag PFL continues to be in the active state to switch the selection circuits 81 to 83 to the recovery operation side until the recovery operation is finished.

With start of the recovery operation, the first counter of the count portion 53 starts counting. At the clock t1, the count value CNT of the first counter becomes "0" as the initial value (FIG. 10E) and the count value CCNT of the second counter becomes the initial value "0" (FIG. 10F). The count value CNT is used to create the address of each memory. Higher-order 9 bits correspond to the address VAD of the valid bit memory 22 and the count value CNT delayed by two clocks corresponds to the address CAD of the cache memory 12. The count value CCNT is used to count the number of pieces of read data.

At the clock t1, reading of the valid bit memory 22 is started. The chip select signal VCS of the valid bit memory 22 becomes active (FIG. 10K) and the write enable signal VWE becomes the read state "read" (FIG. 10L). The valid bit data at the address VAD="0" is output at the clock t2.

At the clock t2, on the basis of the valid bit output from the valid bit memory 22, reading of the internal state data stored in the cache memory 12 is determined. Here, the valid bit data "0" is output (FIG. 10N) and it is determined that the internal state data is stored in the corresponding area. Thus, from the clock t3, reading of the cache memory 12 and the shift operation of the scan chains 300 to 331 are started.

At the clock t3, the chip select signal CSS of the cache memory 12 becomes active (FIG. 10G) and the write enable signal CWE becomes the read state "read". The address CAD becomes "0" (FIG. 10I) and the data is output at the clock t4. Accordingly, the protecting scan enable signal PSE becomes active from the clock t4 and continues to be in the active state to the clock t9 when data of 8 words is shifted.

At the clock t4, the first data CH0 of the internal state data is output from the cache memory 12 (FIG. 10J) and fed to the scan chains 300 to 331. The second counter of the count portion 53 is incremented each time the internal state data are read and thus the count value CCNT becomes "1". In this manner, the internal state data of 8 words corresponding to the valid bit are sequentially read and shifted through the scan chains.

At the clock t7, the address VAD of the valid bit memory 22 becomes "1", the chip select VCS becomes active (FIGS. 10M and 10K) and the next valid bit is read. At the clock t8, the valid bit data "1" is output from the valid bit memory 22 (FIG. 10N) and determination is made that the internal state data is not stored in the corresponding cache memory 12. At the clock t9, the chip select signal CCS of the cache memory 12 becomes inactive (FIG. 10G) and at the clock t10, the protecting scan enable signal PSE becomes inactive (FIG. 10D).

As described above, the recovery operation is performed by reading the valid bit data from the valid bit memory 22, reading the internal state data from the area of the cache memory 12 which is associated with the valid bit indicating "invalid" and feeding the read data to the scan chains 330 to 331. The scan chains 300 to 331 perform the shift operation to transfer the data. In the recovery operation, these steps are repeated until all internal state data is reset in the scan chains 300 to 331.

As shown in FIGS. 11A to 11N, since the valid bit data "1" is stored in the address VAD "111" of the valid bit memory 22, data in the area of 8 words from address CAD "888" to "895" of the cache memory 12 is skipped (FIGS. 11I, 11J and 11M). At the address VAD "112" of the valid bit memory 22 or later, as described above, to store the internal state data in the area up to the address CAD "1023" of the cache memory 12, "0" is stored in the valid bit memory 22 (FIG. 11N). Consequently, after data at the address VAD "112" of the valid bit memory 22 is read at the clock t25, the internal state data is read in the order of the addresses of the cache memory 12 and sequentially fed to the scan chains 300 to 331.

At a clock t31, the count value CNT becomes "1024" and the address VAD of the valid bit memory 22 becomes "128". The valid bit corresponds to the area of 8 words from the address CAD "1024" of the cache memory 12. At a clock t32, the address CAD of the cache memory 12 becomes "1023" (FIG. 11I) and at a clock t33, the internal state data CH255 is fed to the scan chains 300 to 331 (FIG. 11J). The count value CCNT becomes "256" (FIG. 11F), the protecting scan enable signal PSE becomes inactive and the scanning operation of the scan chains 300 to 331 is stopped (FIG. 11D).

In this manner, the internal state data of 256 words, which are saved in the cache memory 12, are reset in the original scan flip-flops. Although the read state of the cache memory 12 is controlled by the chip select signal CCS herein, the state is set as the read state at all times and the read state may be controlled only by shift of the scan chains 300 to 331.

Third Embodiment

In the second embodiment, in saving the internal state data, when the invalid data area is insufficient, the valid data area at a smaller address is left as it is "valid". Here, the invalid data area is an area in which the valid bit is "0", that is, the data stored in the cache memory 12 is "invalid".

In the third embodiment, when the invalid data area is insufficient, the internal state data is stored from the small address of the valid data area.

Since the configuration of a semiconductor integrated circuit apparatus according to the third embodiment is the substantially same as the configuration of the semiconductor integrated circuit apparatus according to the second embodiment, detailed description thereof is omitted. The count portion 53 in the present embodiment further has a fourth counter (not shown). The fourth counter is a down counter which counts the deficient area and sets the count value as DCNT. Here, since the counter counts on the basis of the number of valid bits, the number of words of the cache memory is 8 times as many as the number of valid bits. The fourth counter sets one eighth (round-up) of the number of words of the cache memory 12, in which the internal state data are stored, as the initial value. Here, since the internal state data of 256 words are stored, "32" becomes the initial value.

Figure 12:
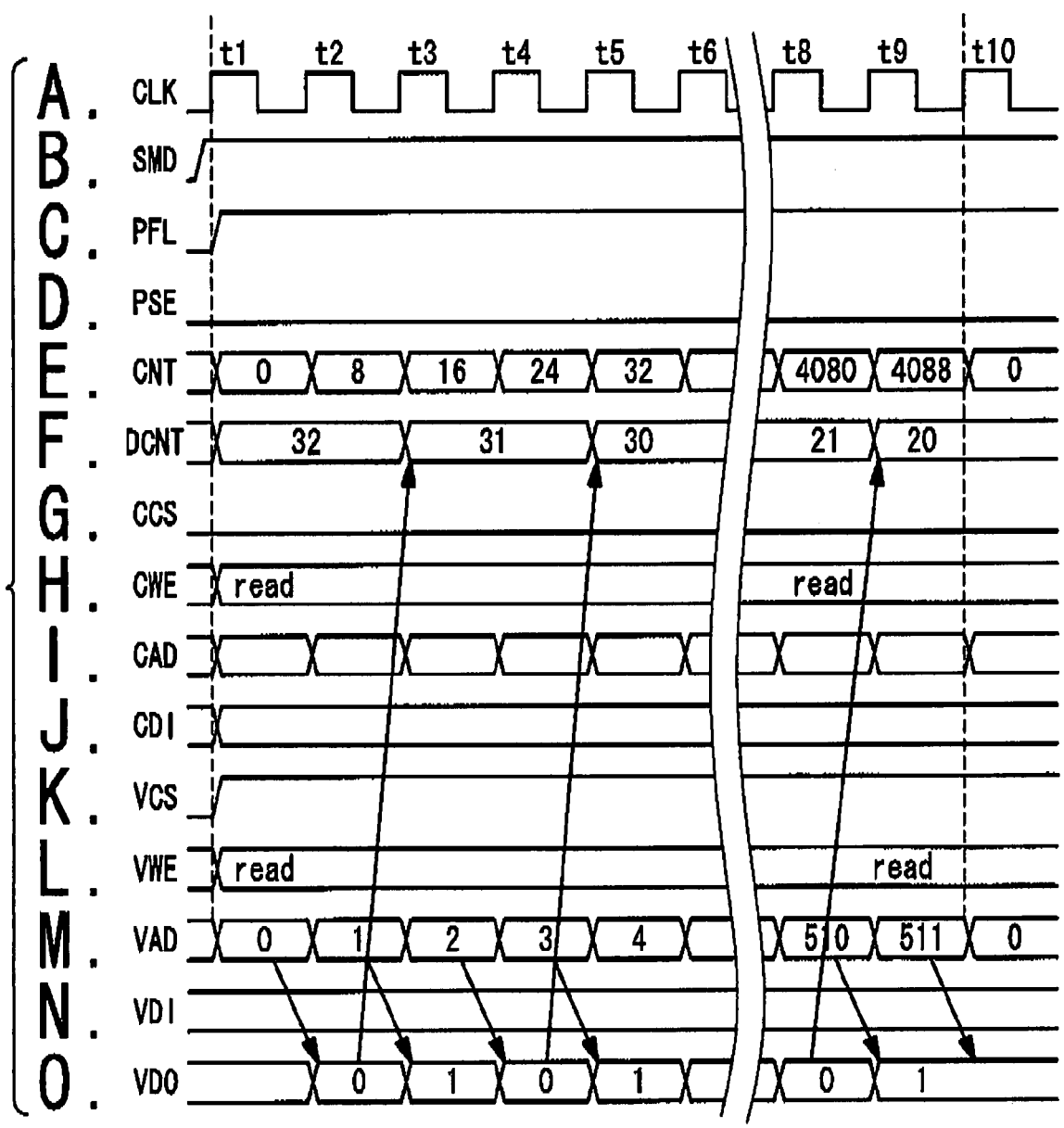
FIGS. 12A to 12O are timing charts (1) for describing a saving operation in accordance with a third embodiment.

Saving of the internal state data, as shown in FIGS. 12A to 12O, is started from counting of the deficient area prior to saving of the internal state data. When the saving mode signal SMD becomes active (FIG. 12B), the data protection state flag PFL becomes active (FIG. 12C). Since then, the data protection state flag PFL continues to be in the active state to switch the selection circuits 81 to 83 to the recovery operation side until the recovery operation is finished.

To count the valid bits stored in the valid bit memory 22, the first counter operates with respect to only higher-order 9 bits as lower-order 3 bits remains "0" and counts from "0" to "4088" (FIG. 12E). Accordingly, the address VAD of the valid bit memory 22 increases at each clock and changes from "0" to "511" (FIG. 12M). The chip select signal VCS is set active (FIG. 12K) and the write enable signal VWE becomes the read state "read" (FIG. 12L). The valid bit memory 22 sequentially outputs the stored valid bit data from the clock t2 (FIG. 12O). Each time when it is detected that the output VDO of the valid bit memory 22 is "0", the count value DCNT is decremented (FIG. 12F). Here, the valid bits at the addresses VAD are "0", "2", ..., "509" represent "invalid" (FIGS. 12M and 12O) and at the clocks t3, t5, ..., t9, the count value DCNT is decremented. Accordingly, at the clock t10, the count value DCNT is "20" (FIG. 12F). This means that the invalid data area of 20 words lacks. When the internal state data is going to be saved, the internal state data are overwritten to 20 words in the valid data area and the area is changed to the invalid data area.

Figure 13:
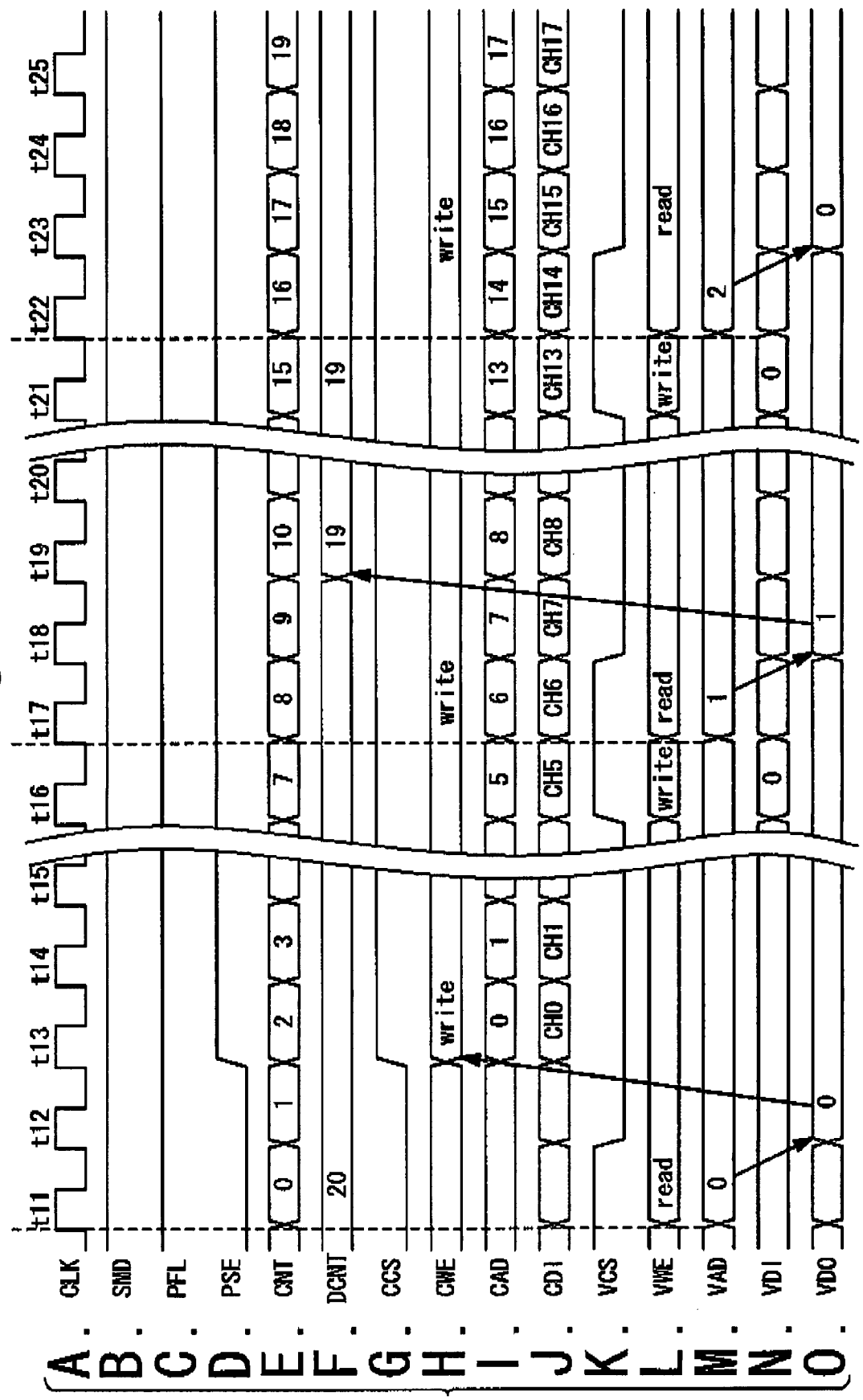
FIGS. 13A to 13O are timing charts (2) for describing the saving operation in accordance with the third embodiment.

When counting of the deficient area is finished, as shown in FIGS. 13A to 13O, the saving operation of the internal state data is started. Although the read/write timing of each memory is the same as that in the second embodiment, the start timing of writing the deficient internal state data to the valid data area is different from that in the second embodiment.

At the clock t11, the count value CNT becomes "0" (FIG. 13E), the chip select signal VCS becomes active (FIG. 13K and the write enable signal VWE becomes the read state "read" (FIG. 13L). At the clock t12, the valid bit memory 22 outputs the valid bit data "0" of the address VAD "0" (FIG. 13O).

Since the valid bit data is "0", the internal state data are stored in the cache memory 12. At the clock t13, the chip select signal CSS of the cache memory 12 becomes active (FIG. 13G) and the write enable signal CWE becomes the write state "write" (FIG. 13H). The internal state data CH0 output from the scan chains 300 to 331 are written to the address CAD "0" of the cache memory 12 (FIGS. 13I and 13J). And then, up to the clock t18, the internal state data are sequentially written to the cache memory 12 until the address CAD becomes "7". At the clock t16, as described in the second embodiment, the data "0" indicating invalid is written to the valid bit memory 22 to unify the writing operation to the cache memory 12.

At the clock t17, data at the address VAD "1" of the valid bit memory 22 is read (FIGS. 13L and 13M). At the clock t18, the output signal VD0 of the valid bit memory 22 becomes "1" indicating the valid data area. At this time, since the count value DCNT is "20" (FIG. 13F), the internal state data are also written to the valid data area. Thus, at the clock t19, the count value DCNT is decremented to become "19" (FIG. 13F). At the same time, the internal state data CH8 are stored at the address CAD "8" of the cache memory 12.

Thus, the internal state data are also written to the valid data area until the count value DCNT becomes "0" and the count value DCNT is decremented. That is, until the count value DCNT becomes "0", the internal state data are continuously stored in the cache memory 12 and the valid data area are changed to the invalid data area.

Figure 14:
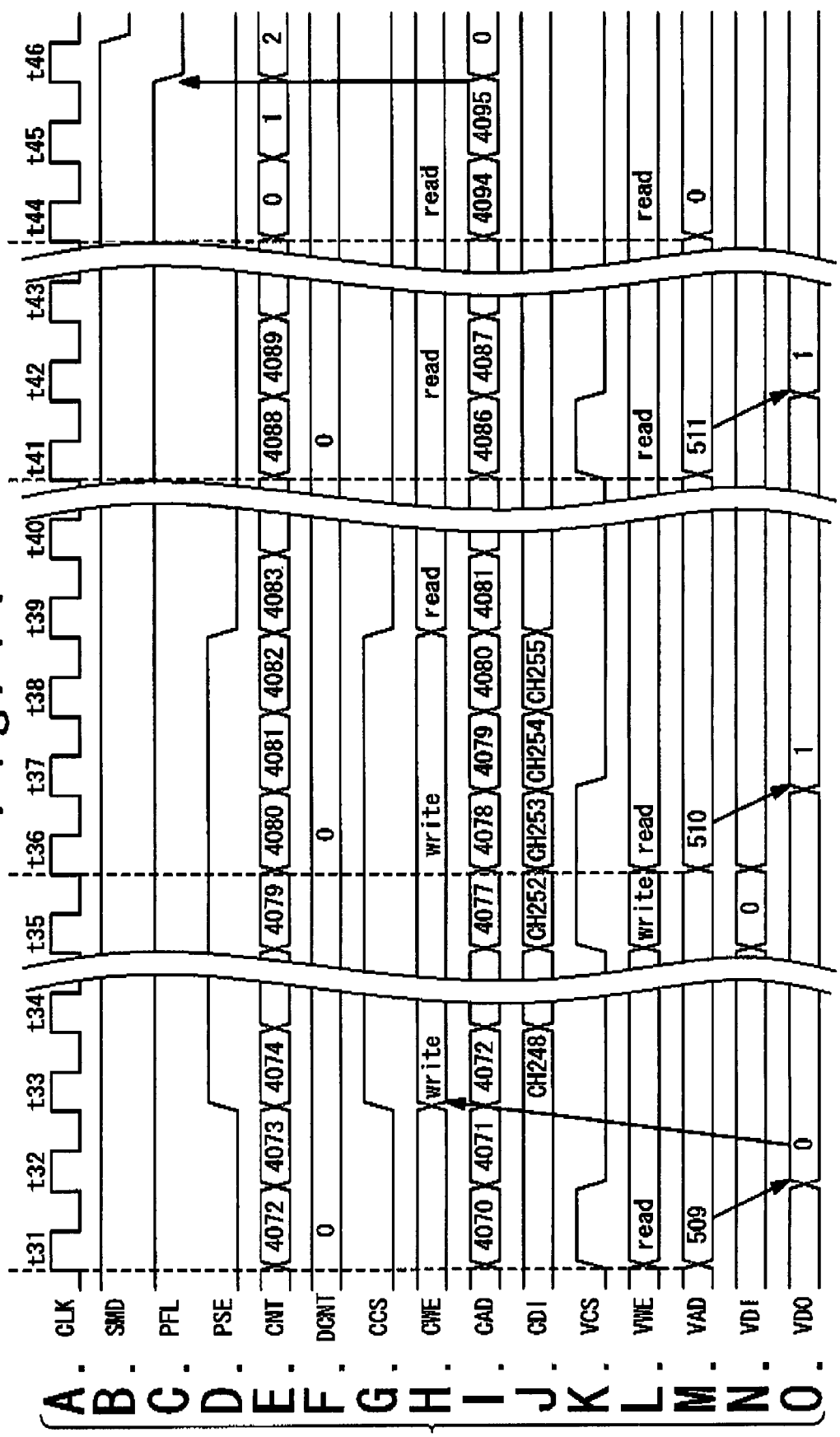
FIGS. 14A to 14O are timing charts (3) for describing the saving operation in accordance with the third embodiment.

FIGS. 14A to 14O are views showing the end of the saving operation. The count value DCNT becomes "0" and the internal state data are stored only in the invalid data area. At the clock t31, the count value CNT becomes "4072" (FIG. 14E) and the valid bit-stored at the address VAD "509" of the valid bit memory 22 is read (FIGS. 14K, 14L and 14M). The output VDO of the valid bit memory 22 represents "0" (FIG. 14O) and the internal state data are written to the area of the cache memory 12 corresponding to the valid bit. From the clock t33 to the clock t38, the internal state data CH248 to CH255 are written to the addresses CAD "4072" to "4080" of the cache memory 12 (FIGS. 14G, 14H, 14I and 14J).

At clocks t36 and t41, the valid bit data at the addresses VAD "510", "511" are separately read (FIGS. 14K, 14L and 14M). Since the valid bit data at the addresses VAD "510", "511" are "1" and the count value DCNT is "0", the internal state data are not written to the cache memory 12.

At a clock t45, the final address "4095" of the cache memory 12 is output (FIG. 14I). And then, the data protection state flag PFL becomes inactive and the saving operation is finished (FIG. 14C). At a clock t38, the internal state data CH255 are written to the cache memory 12. Consequently, when the number of pieces of the saved internal state data, it is possible to finish the saving operation at the clock t38.

To reset the internal state data in the scan flip-flops, as in the second embodiment, the invalid data area of the cache memory 12 may be sequentially read and fed to the scan chains 300 to 331.

As described above, when the internal state data are stored in the unused area (invalid data area) of the cache memory 12 and the unused area is insufficient, the valid data area on the side of the head of the cache memory 12 can be changed to the invalid data area to store the internal state data therein. By storing the internal state data in the invalid data area, it is possible to leave initial data in the cache memory, thereby enabling the operation after recovery of the internal state data to be nearly same as the operation before recovery.

Furthermore, the operation in the second embodiment can be combined with the operation in the third embodiment. An arbitrary area in the cache memory may be used as the area in which the internal state data are saved. Thus, it is possible to set the area in which the internal state data are saved while preventing the frequently-used area in the cache memory.

As described above, according to the present invention, when power supply to the semiconductor integrated circuit apparatus is interrupted, data indicating the internal state which are stored in the flip-flops of the semiconductor integrated circuit apparatus can be stored in the cache memory. By resetting the data stored in the cache memory when returning from interruption of power supply, the time required to return from interruption of power supply can be reduced with a small number of additional circuits.

When the data in the flip-flops of the semiconductor integrated circuit apparatus is stored in the cache memory, the data is preferentially stored in the invalid cache memory area. Only when the invalid cache memory area is insufficient for the data amount in the flip-flops, the requisite minimum valid bit in the cache memory area is made invalid to store the data in the flip-flops. By doing so, deletion of the contents in the cache memory can be minimized.

It is apparent that the present invention is not limited to the above embodiment that may be modified and changed without departing from the scope and spirit of the invention.

What is claimed is:

1. A semiconductor integrated apparatus comprising:
an internal logic circuit configured to include scan chains which test the semiconductor integrated apparatus normality;
a first memory configured to be accessed by said internal logic circuit;
a second memory configured to store valid bits associated with said first memory, wherein said valid bits indicates one of validity and invalidity of data stored in said first memory; and
a control circuit configured to save internal state data stored in said scan chains to said first memory, and reset said internal state data saved in said first memory to said scan chains.

2. The semiconductor integrated apparatus according to claim 1, wherein after said internal state data stored in said scan chains are saved to said first memory, power supply to said internal logic circuit is stopped while power supply to said first memory and said second memory is continued, and
when power supply to said internal logic circuit is restarted, said internal state data saved in said first memory is reset to said scan chains.

3. The semiconductor integrated apparatus according to claim 1, wherein said control circuit saves said internal state data to a sequence area from a certain address of said first memory,
said control circuit saves said valid bits indicating invalidity associated with said sequence area to said second memory, and
said control circuit resets said internal state data saved to said sequence area to said scan chains.

4. The semiconductor integrated apparatus according to claim 1, wherein said control circuit includes:
a scan enable creation portion configured to determine whether or not said valid bits stored in said second memory indicate invalidity,
wherein said control circuit saves said internal state data to invalid area of said first memory, said invalid area is associated with said valid bits indicating invalidity which is determined by said scan enable creation portion.

5. The semiconductor integrated apparatus according to claim 4, wherein when said first memory is deficient in said invalid area to be selected for saving said internal state data,
said control circuit saves said internal state data to an area, of which said valid bits indicate invalidity, included in a first area of said first memory, and all of a second area of said first memory, and said control circuit saves said valid bits indicating invalidity and associated with said area of said first memory saving said internal state data to said second memory.

6. The semiconductor integrated apparatus according to claim 5, wherein a last address of said first area and a starting address of said second area are sequential, and
said control circuit dynamically determines a start address which indicates a boundary between said first area and said second area and is included in said second memory, based on a size of said area, where said valid bits indicate invalidity, and which is included in said first area.

7. The semiconductor integrated apparatus according to claim 5, wherein a last address of said second area and a starting address of said first area are sequential, and
said control circuit determines an end address of said second memory, based on a size of said area, where said valid bits indicate invalidity, and which is included in said first area and said second area.

8. The semiconductor integrated apparatus according to claim 4, wherein said control circuit resets data, which are saved to an area of said first memory and are associated with said valid bits indicating invalidity and saved to said second memory, as said internal state data to said scan chains.

9. The semiconductor integrated apparatus according to claim 1, wherein said first memory is a cache memory which is provided for reducing access to a low speed memory.

10. A control method of a semiconductor integrated apparatus, comprising:
(a) providing a semiconductor integrated apparatus which includes:
an internal logic circuit configured to include scan chains which test circuit normality,
a first memory configured to be accessed by said internal logic circuit, and
a second memory configured to store valid bits associated with said first memory, wherein said valid bits indicates one of validity and invalidity of data stored in said first memory;
(b) saving internal state data stored in said scan chains to said first memory; and
(c) resetting said internal state data saved in said first memory to said scan chains.

11. The control method of a semiconductor integrated apparatus according to claim 10, wherein said step (b) includes:
(b1) after saving said internal state data stored in said scan chains to said first memory, stopping power supply to said internal logic circuit while continuing power supply to said first memory and said second memory, and
(b2) restarting power supply to said internal logic circuit, wherein said step (c) is carried out after said step (b2) is carried out.

12. The control method of a semiconductor integrated apparatus according to claim 10, wherein said step (b) includes:
(b3) saving said internal state data to a sequence area from a certain address of said first memory, and
(b4) saving said valid bits indicating invalidity associated with said sequence area to said second memory,
wherein said step (c) includes:
(c1) resetting said internal state data saved to said sequence area to said scan chains.

13. The control method of a semiconductor integrated apparatus according to claim 10, wherein said step (b) includes:
(b5) determining whether or not said valid bits stored in said second memory indicate invalidity, and (b6) saving said internal state data to invalid area of said first memory, said invalid area is associated with said valid bits indicating invalidity which is determined by said scan enable creation portion.

14. The control method of a semiconductor integrated apparatus according to claim 13, wherein said step (b) further includes:
(b7) when said first memory is deficient in said invalid area to be selected for saving said internal state data, saving said internal state data to an area, of which said valid bits indicate invalidity, included in a first area of said first memory, and all of a second area of said first memory, and
(b8) saving said valid bits indicating invalidity and associated with said area of said first memory saving said internal state data to said second memory.

15. The control method of a semiconductor integrated circuit according to claim 14, wherein a last address of said first area and a starting address of said second area are sequential, and
wherein said step (b7) includes:
(b71) dynamically determining a start address which indicates a boundary between said first area and said second area and is included in said second memory, based on a size of said area, where said valid bits indicate invalidity, and which is included in said first area.

16. The control method of a semiconductor integrated apparatus according to claim 14, wherein a last address of said second area and a starting address of said first area are sequential, and
wherein said step (b7) includes:
(b72) determining an end address of said second memory, based on a size of said area, where said valid bits indicate invalidity, and which is included in said first area and said second area.

17. The control method of a semiconductor integrated apparatus according to claim 13, wherein said step (c) includes:
(c1) resetting data, which are saved to an area of said first memory and are associated with said valid bits indicating invalid and saved to said second memory, as said internal state data to said scan chains.

18. The control method of a semiconductor integrated apparatus according to claim 10, wherein said first memory is a cache memory which is provided for reducing access to a low speed memory.

* * * * *